United States Patent
Serbicki

(10) Patent No.: US 10,431,955 B2
(45) Date of Patent: Oct. 1, 2019

(54) LASER CORE HAVING CONDUCTIVE MASS ELECTRICAL CONNECTION

(71) Applicant: LaserMax, Inc., Rochester, NY (US)

(72) Inventor: Jeffrey P. Serbicki, Holly, NY (US)

(73) Assignee: LMD Power of Light Corp, Rochester, NY (US)

( * ) Notice: Subject to any disclaimer, the term of this patent is extended or adjusted under 35 U.S.C. 154(b) by 1230 days.

(21) Appl. No.: 14/694,431

(22) Filed: Apr. 23, 2015

(65) Prior Publication Data

US 2018/0254592 A1 Sep. 6, 2018

Related U.S. Application Data

(60) Provisional application No. 61/984,128, filed on Apr. 25, 2014.

(51) Int. Cl.
| | |
|---|---|
| H01S 5/022 | (2006.01) |
| H01S 5/042 | (2006.01) |
| H01S 5/024 | (2006.01) |
| F41G 1/35 | (2006.01) |
| F41G 1/36 | (2006.01) |
| H01S 5/40 | (2006.01) |
| H01S 5/34 | (2006.01) |

(52) U.S. Cl.
CPC ...... *H01S 5/02272* (2013.01); *H01S 5/02276* (2013.01); *H01S 5/0425* (2013.01); *H01S 5/3402* (2013.01); *H01S 5/4037* (2013.01); *H01S 5/4087* (2013.01); *F41G 1/35* (2013.01); *F41G 1/36* (2013.01); *H01S 5/02212* (2013.01); *H01S 5/02288* (2013.01); *H01S 5/02415* (2013.01); *H01S 5/3401* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,181,043 A | * | 4/1965 | Cutter | H01L 23/041 257/682 |
| 4,524,038 A | * | 6/1985 | Heinemann | G01N 27/4075 264/614 |
| 4,850,105 A | * | 7/1989 | Nakajima | H01L 21/568 29/841 |
| 5,311,530 A | * | 5/1994 | Wagner | H01L 33/648 372/34 |
| 5,325,384 A | * | 6/1994 | Herb | H01S 5/02 372/36 |
| RE35,069 E | * | 10/1995 | Hallenbeck | H01L 24/81 250/216 |

(Continued)

FOREIGN PATENT DOCUMENTS

JP 2004356233 A * 12/2004 .......... G02B 6/4201

*Primary Examiner* — Joshua King
(74) *Attorney, Agent, or Firm* — Lee & Hayes, P.C.

(57) ABSTRACT

Laser cores are provided having a header having a base with a stem extending therefrom; a terminal extending from a sealed opening in the base proximate to but separate from the stem; a conductive surface electrically connected to the laser and positioned between the stem and the terminal; and a conductive mass between the terminal and the conductive surface having a cross-sectional area that is based upon a size of an overlap area between the terminal and the conductive surface.

20 Claims, 17 Drawing Sheets

(56) References Cited

U.S. PATENT DOCUMENTS

| | | | | |
|---|---|---|---|---|
| 5,468,683 A * | 11/1995 | Van De Pas | B21J 5/12 228/180.22 |
| D505,664 S * | 5/2005 | Takagi | D13/182 |
| 6,920,161 B2 * | 7/2005 | Riaziat | H01S 5/02212 372/34 |
| 7,154,926 B2 * | 12/2006 | Kouta | H01S 5/02264 372/38.05 |
| 2001/0006235 A1 * | 7/2001 | Ozawa | H01L 33/40 257/79 |
| 2003/0215056 A1 * | 11/2003 | Vuorela | H01L 27/14634 378/62 |
| 2004/0037334 A1 * | 2/2004 | Funada | H01S 5/02248 372/50.21 |
| 2004/0081410 A1 * | 4/2004 | Aronson | H01S 5/02212 385/92 |
| 2004/0141535 A1 * | 7/2004 | Sunaga | H01S 5/02288 372/29.02 |
| 2004/0144554 A1 * | 7/2004 | Reznik | H01L 23/045 174/538 |
| 2004/0151505 A1 * | 8/2004 | Aronson | H01S 5/02212 398/138 |
| 2004/0184753 A1 * | 9/2004 | Teramura | G02B 6/4248 385/128 |
| 2004/0208211 A1 * | 10/2004 | Maruyama | H01S 5/02212 372/38.1 |
| 2005/0013561 A1 * | 1/2005 | Kuhara | G02B 6/4201 385/92 |
| 2005/0047460 A1 * | 3/2005 | Go | H01S 5/02212 372/43.01 |
| 2005/0089070 A1 * | 4/2005 | Honda | H01S 5/02212 372/36 |
| 2005/0105911 A1 * | 5/2005 | Keh | H01S 5/02212 398/138 |
| 2006/0045437 A1 * | 3/2006 | Tatum | H01S 5/02248 385/92 |
| 2006/0186427 A1 * | 8/2006 | Takine | H01L 25/167 257/99 |
| 2007/0147449 A1 * | 6/2007 | Bessho | H01S 5/02212 372/36 |
| 2008/0291960 A1 * | 11/2008 | Inoue | H01S 5/0425 372/45.01 |
| 2009/0080485 A1 * | 3/2009 | Yamasaki | B82Y 20/00 372/50.1 |
| 2009/0251697 A1 * | 10/2009 | Cutillas | H01S 5/02248 356/400 |
| 2010/0213471 A1 * | 8/2010 | Fukasawa | H01L 24/37 257/82 |
| 2010/0260226 A1 * | 10/2010 | Tamaya | H01S 5/02276 372/50.12 |
| 2011/0140284 A1 * | 6/2011 | Gunther | H01L 25/0753 257/777 |
| 2012/0177074 A1 * | 7/2012 | Liu | H01S 5/02236 372/36 |
| 2015/0318664 A1 * | 11/2015 | Eckert | H01S 5/02208 372/44.01 |
| 2017/0133821 A1 * | 5/2017 | Kimura | H01S 5/02276 |

\* cited by examiner

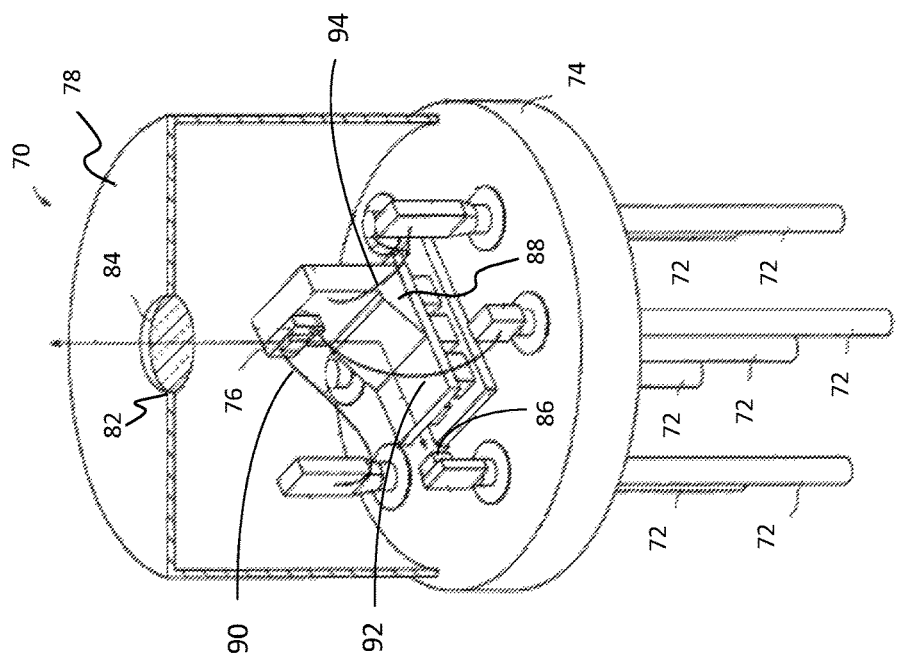
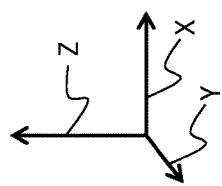
FIG. 5 PRIOR ART

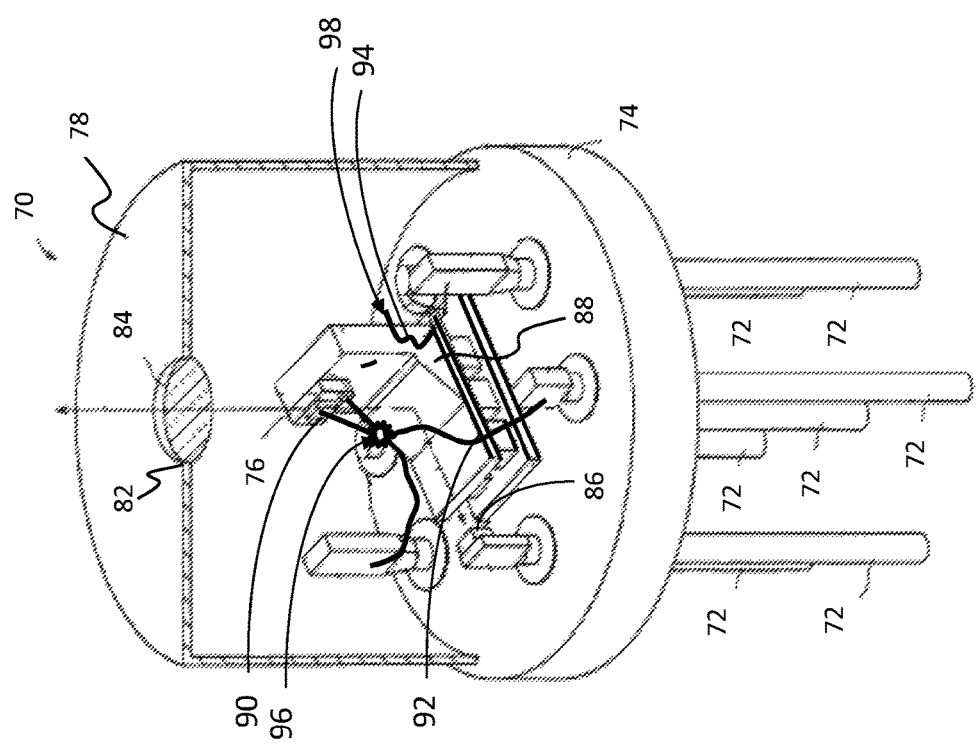
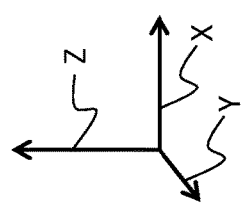
FIG. 6 PRIOR ART

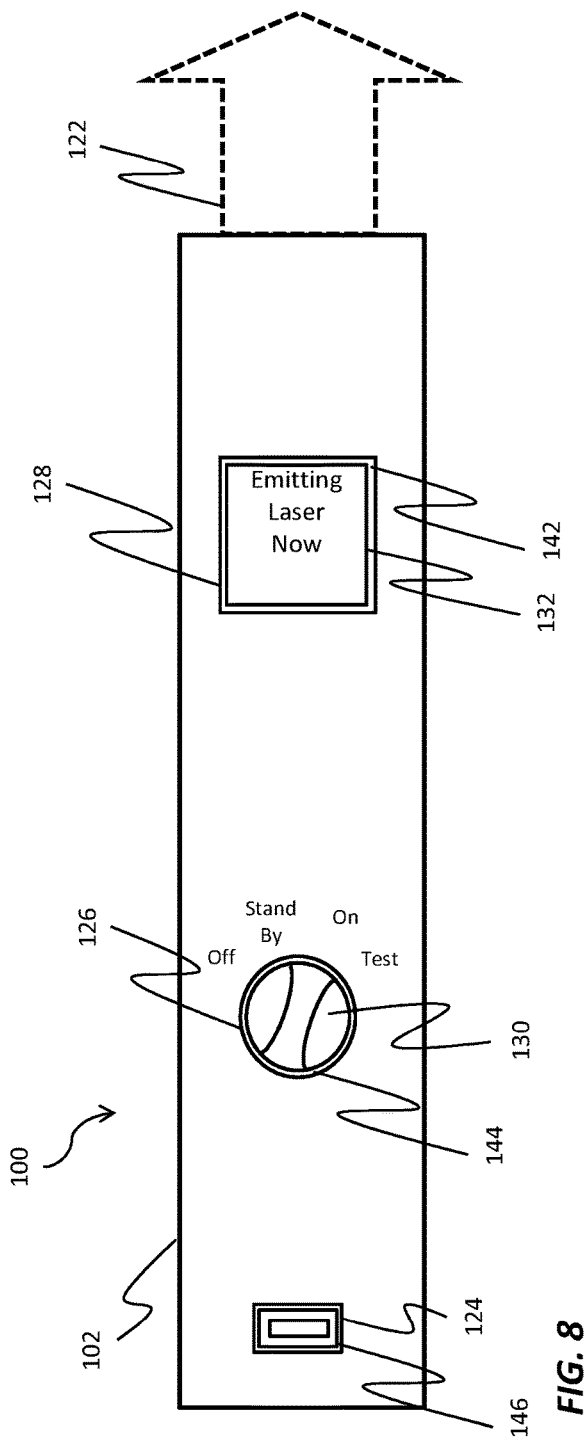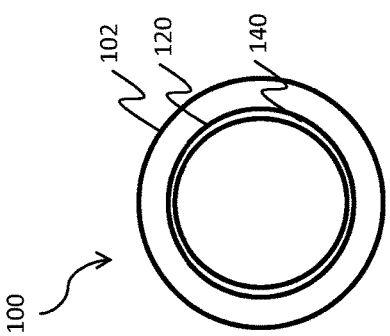
*FIG. 8*
*FIG. 9*

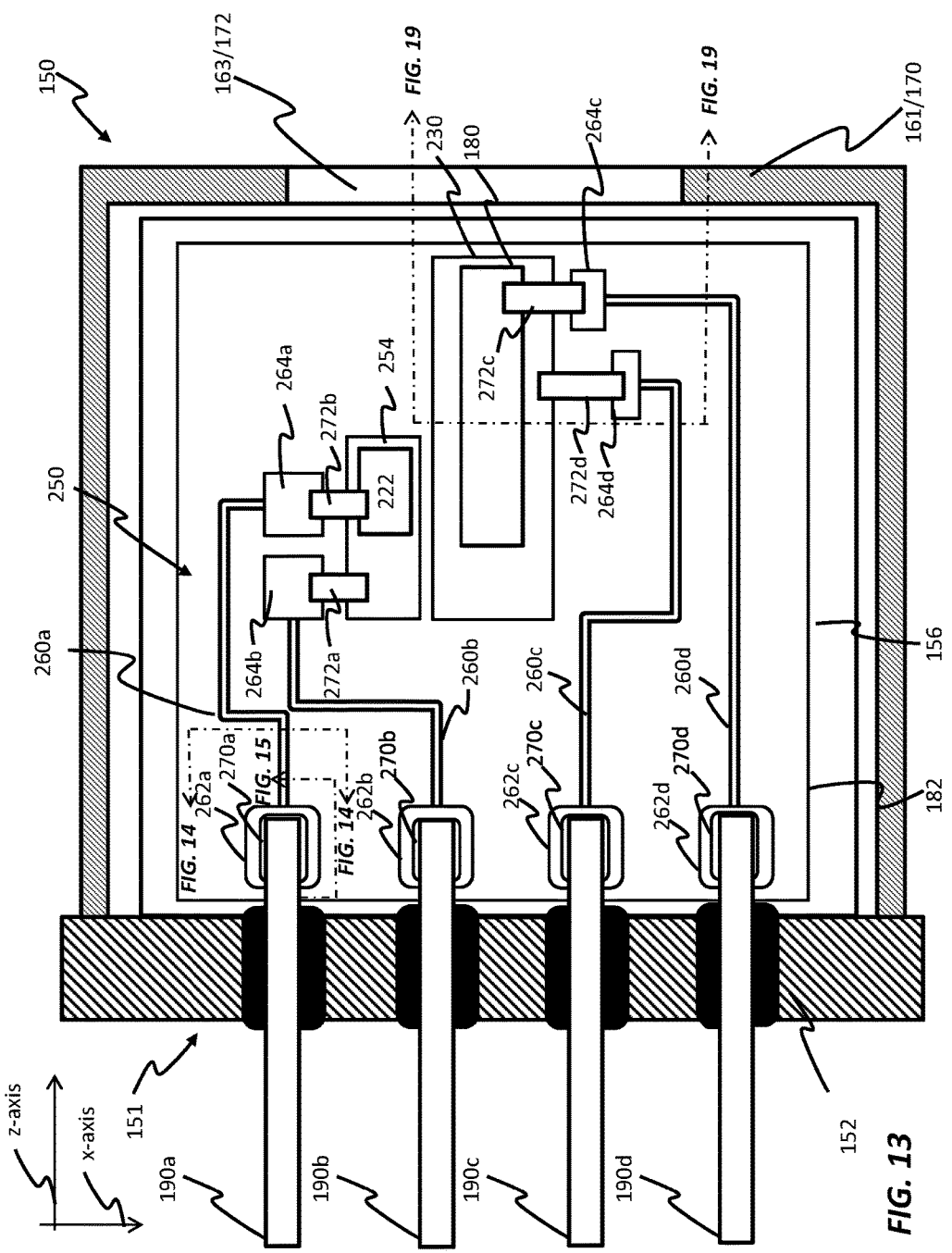

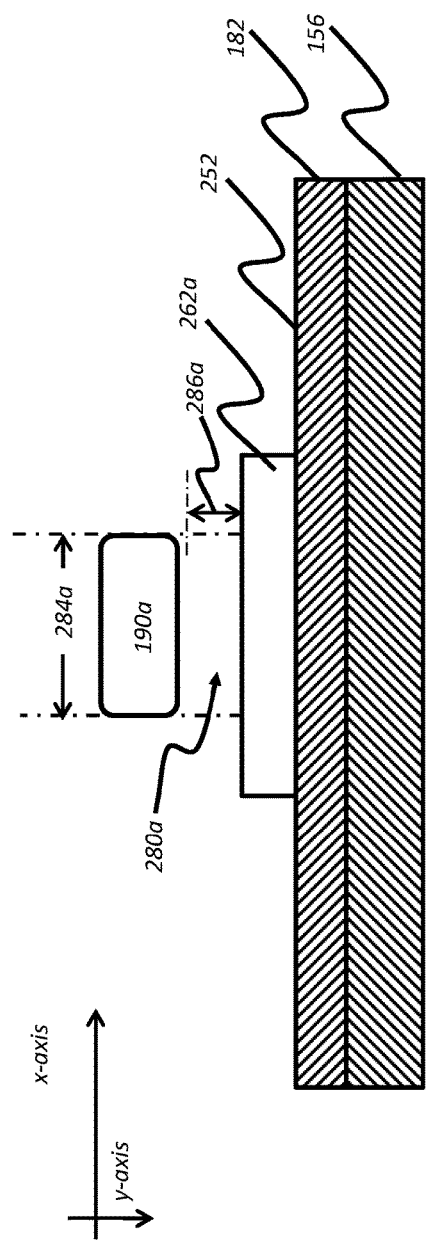
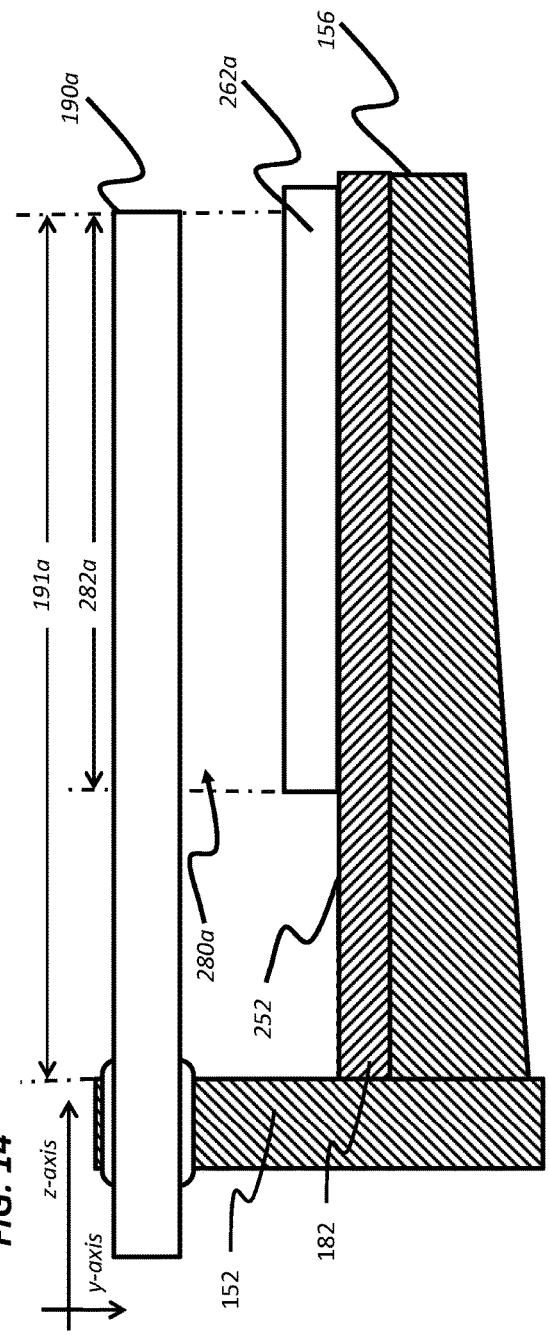
FIG. 14
FIG. 15

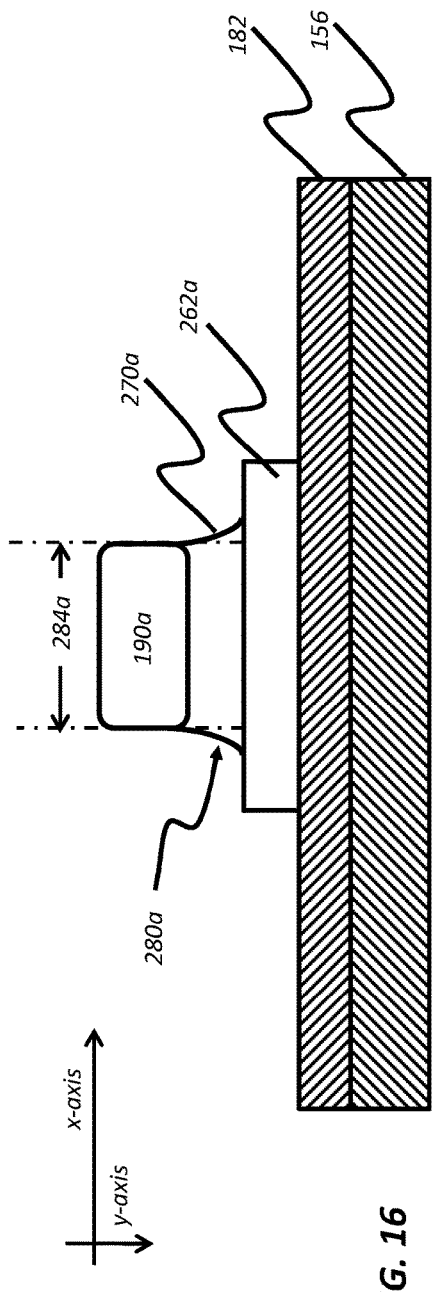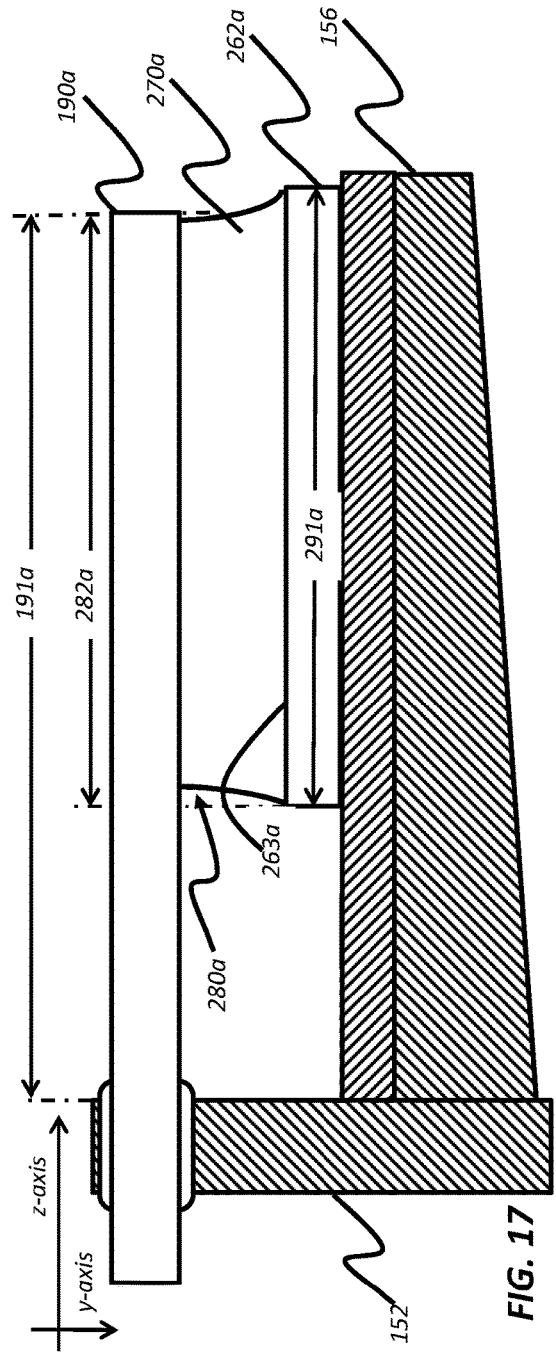
FIG. 16
FIG. 17

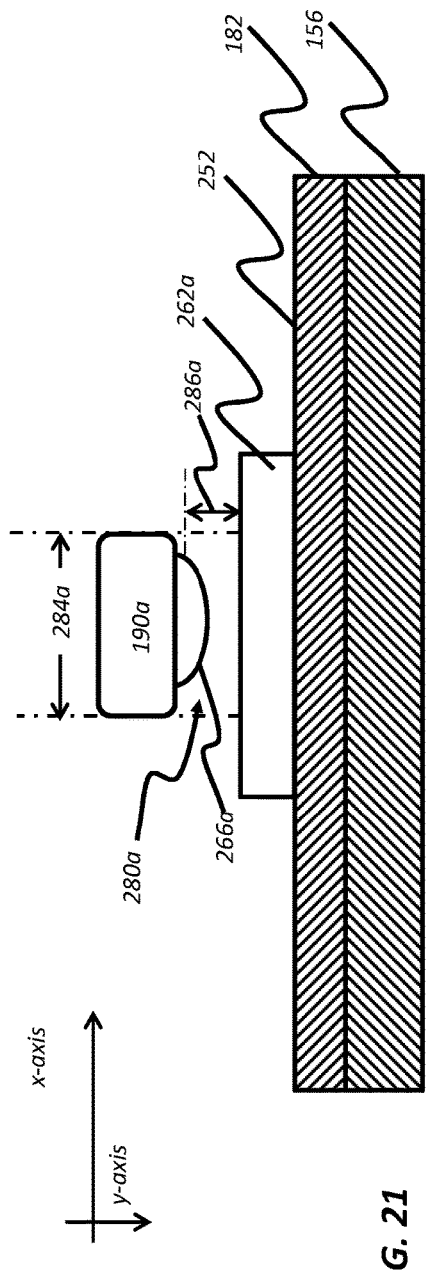
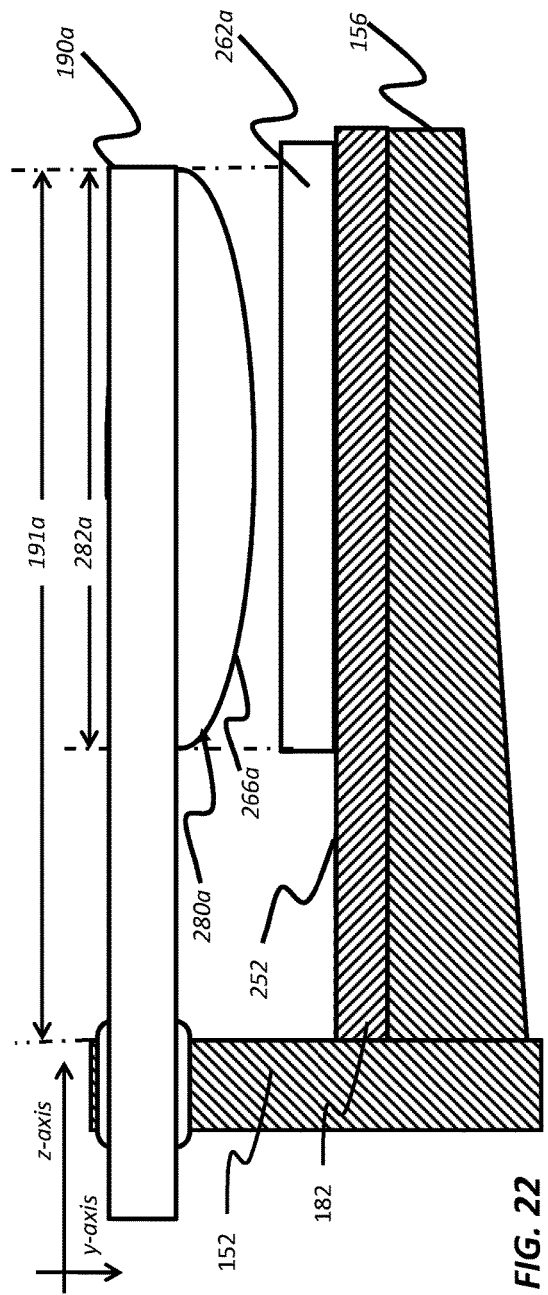

LASER CORE HAVING CONDUCTIVE MASS ELECTRICAL CONNECTION

CROSS-REFERENCE TO RELATED APPLICATIONS

This application claims the benefit of U.S. Provisional Application, 61/984,128, filed Apr. 25, 2014.

STATEMENT REGARDING FEDERALLY SPONSORED RESEARCH OR DEVELOPMENT

Not applicable.

FIELD OF THE INVENTION

The present invention relates to solid state laser modules and laser systems that incorporate solid state laser modules.

DESCRIPTION OF RELATED ART

Laser devices that incorporate solid state lasers are used for a variety of applications including, but not limited to, applications such as target marking, pointing, designating, aiming, data communication, remote sensing and stand-off spectral analysis. These applications require that a laser beam be generated that travels through free space to create a laser spot on a distant target that reflects enough light to be observed or sensed by an electronic sensor such as a spectrometer, a spectrophotometer or an array type image sensor that may itself be a great distance from the target. Such applications require a laser system that can emit a laser beam with limited divergence.

In many of these applications, it is also necessary that such laser devices are in a form that is easily transported to a point of use and that can be readily and reliably operated when needed. This requires laser devices that are lighter, have a relatively small cross-sectional area and reduced volume while still being robust enough to operate after being exposed to vibration, tension, compression, bending forces, torsional loads, and environmental extremes during transport and use. It is particularly important in military, homeland security, and first responder applications that such laser devices will remain operational even when exposed to high levels of shock.

Bonding wires, also known as wire bonds, are frequently used for making electrical connections between fixed components of a laser module. For example, a common use of a wire bond is to join electrical terminals of the laser module the laser or to sensors within the module. Wire bonds are typically made using popular conductors such as gold, aluminum, and copper. These wire bonds are often ultrasonically, thermosonically, or thermally welded at each end to form a physical and electrical connection to the components of the laser module and extend unsupported through free space within the laser module.

It will be appreciated that wire bonds used in mobile products such as handheld or otherwise portable products are exposed to vibrations of various types and intensities. As is noted, for example, in U.S. Pat. No. 6,668,667, such vibrations can create stress in the wire bonds and can cause deformation of the wire bonds including plastic deformation of the wire bonds. Over time, these effects can cause fatigue failures such as a failure known as a "heel crack" which frequently occur at a kink point at or near a bonding point. The vibrational accelerations that such devices are exposed to are usually within a limited range of peak accelerations and testing techniques and devices such as those that are described in the '667 patent can be used to apply vibrational accelerations to such devices to simulate the effects of such vibrational accelerations on wire bonds used in particular applications.

However, some applications require devices that can survive peak accelerations that are significantly larger than those associated with conventional vibrational accelerations. For example, and without limitation, weapons mounted laser systems, vehicle mounted laser systems, aircraft and other aerospace vehicle mounted laser systems can be exposed to higher order transient accelerations that are an order of magnitude or more greater than those of conventional vibrational accelerations during weapons discharge, during take-off, upon landing or in extreme maneuvering.

Such higher order of transient accelerations can induce separation of freely moving portions of the wire bond from bound portions of the wire bond and or can cause plastic deformation of the wire bond leading to increased resistance within the laser module. Additionally, such high levels of shock can cause wire bonds two separate from surfaces to which they are bound and can induce failure of materials in the surfaces to which the wire bond is mounted such that the wire bond remains attached to the substrate but the substrate itself fractures and separates from remaining portions of the substrate.

Such higher order transient accelerations can also bring separate wire bonds into temporary or permanent contact thereby disrupting electrical systems. The latter risk is particularly acute in laser modules to which multiple wire bonds are connected in relatively close proximity in order to provide desirable patterns of conductivity.

FIGS. 1 and 2 are a generally side elevation view and a top view of a person 10 with a hand held weapon system 12 having a laser device 14. As is shown in FIGS. 1 and 2, laser device 14 sits below hand held weapon system 12 and has a bore axis 20 along which a projectile fired by hand held weapon system 12 will travel. In the embodiment of FIGS. 1 and 2, bore axis 20 is aligned relative to a z-axis. Similarly, an optical axis 22 of laser 14 is aligned relative to the z-axis. In the embodiment that is illustrated, bore axis 20 and optical axis 22 are parallel to each other and to the z-axis. In other embodiments, there may be divergence between bore axis 20 and optical axis 22 so as to provide, for example, elevation adjustments and parallax adjustments.

When hand-held weapon system 12 is fired, the detonation of a charge in hand-held weapon system 12 accelerates a projectile (not shown) in a first direction 40 along the z-axis while hand-held weapon system 12 and laser system 14 experience acceleration in a second direction 42 along the z-axis. However, these are not the only accelerations experienced by hand-held weapon system 12 and laser device 14.

FIG. 3 is a side elevation view of person 10 and hand-held weapon system 12 immediately after discharge of a projectile (not shown) and illustrates that such discharge causes z-axis acceleration in second direction 42 and also causes y-axis acceleration 50 that can thrust hand-held weapon system 12 upwardly. In the case of hand-held weapon system 12, y-axis acceleration 50 causes hand-held weapon system 12 to move along an arcurate path 52. Alternatively, in some other circumstances, (not shown) y-axis acceleration 50 can cause handheld weapon system 12 to move downwardly. Here too, such downward movement may follow an arcurate path.

Additionally, as is shown in FIG. 4, discharge of a projectile (not shown) from hand-held weapon system 12 can also induce x-axis accelerations 60 or 62 which, in the case of hand-held weapon system 12 can cause side to side arcurate motions 66 and 64 of hand-held weapon system 12.

Z-axis, y-axis and x-axis accelerations at hand-held weapon system 12 can occur simultaneously, can overlap or can otherwise occur in ways that combine to provide higher order transitory accelerations. Often such higher order transient accelerations follow a sinusoidal acceleration and damping pattern such that hand-held weapon system 12 experiences positive and negative accelerations along the z-axis, y-axis and x-axis in the few milliseconds after discharge of a projectile.

The accelerations experienced by hand-held weapon system 12 are transmitted to laser module 14 and can cause wire bonds used in the laser device to move in ways that can interrupt operations of laser device 14.

FIGS. 5 and 6 illustrate potential implications of the movement of wire bonds used in laser device 14 by illustrating one example of a prior art laser module 70. As is shown in FIG. 5, prior art laser device 70 has pins 72 that extend through a base 74 and a header 88 extending from base 74 to support a laser 76. A housing 78 encloses pins 72, header 88 and laser 76. An opening 82 in housing 78 has a lens 84 that focuses light from laser 76.

As is shown in FIG. 5, a first wire bond 90 extends from one of pins 72 to laser 76, a second wire bond 92 similarly extends from one of pins 72 to a sensor 86 and a third wire bond 94 extends from one of pins 72 to header 88. It will be appreciated from FIG. 5 that first wire bond 90, second wire bond 92, and third wire bond 94 are joined only at respective ends of each wire bond and otherwise extend across significant distances through free space. Accordingly, exposure of laser device 70 to transient higher order accelerations can cause any of a range of failures at wire bonds 90, 92 and 94.

FIG. 6 illustrates a potential outcome when laser module 70 is exposed to transient higher order accelerations. As is shown in FIG. 6, these transient high order accelerations alter the shape and relative position of first wire bond 90 and second wire bond 92 such that first wire bond 90 and second wire bond 92 come into contact creating a short 96. As is also illustrated in FIG. 6, the shock to which prior art laser device 70 is exposed also causes a fracture 98 in third wire bond 94. Other failure modes are possible.

For these reasons, among others, semiconductor devices are subjected mechanical shock testing to demonstrate the survivability of the devices. One example of such a shock test is MIL-STD-833, Method 2002. This method requires among other things that semiconductor device be capable of surviving transient accelerations of up to 30,000 times the acceleration of gravity. However, an approach of simply testing and iteratively redesigning semiconductor devices with shorter or repositioned wire bonds that are calculated to survive such tests is expensive and time-consuming.

In one alternative approach, US Pat. Pub. 2012/0027040 describes a system in which wire bonds are encased in a resin after manufacture in order to hold such wire bonds in a predetermined position relative to each other and relative to the laser module. However, such an approach traps heat within the laser module and cannot be effectively used with lasers that generate substantial amounts of heat.

In another alternative approach, U.S. Pat. No. 6,717,100 describes the use of ribbon type conductors to join components within an electrical system and suggests that in some cases the same ribbon can be bonded twice to structures to which it is joined so as to achieve better current distribution and a more reliable bond. This however requires joining the wire bonds to surfaces multiple times in quick succession which can itself cause damage to the surfaces or to the ribbon conductors. Additionally, this approach provides improved fixation of the wire bonds without addressing the risks associated with accelerating the wire bonds.

Additionally, it will be appreciated that conventional wire bond forming technologies require that a first surface to which a wire bond is joined be separated from a second surface to which the wire bond is joined either along, for example, an x-axis or a y-axis. Accordingly the use of conventional wire bond technologies requires that the size of a structure on which wire bonds are to be used to be increased along the x-axis or the y-axis to accommodate the need for translation.

What are needed in the art therefore are new laser module designs having reduced dependence upon wire bond technologies.

SUMMARY OF THE INVENTION

In aspects of the invention, laser cores are provided having a header having a base with a stem extending therefrom; a terminal extending from a sealed opening in the base proximate to but separate from the stem; a conductive surface electrically connected to the laser and positioned between the stem and the terminal; and a conductive mass between the terminal and the conductive surface having a cross-sectional area that is based upon a size of an overlap area between the terminal and the conductive surface.

BRIEF DESCRIPTION OF THE DRAWINGS

FIG. 5 illustrates one example of a prior art laser device having wire bonds.

FIG. 6 illustrates the example of FIG. 5 after exposure to mechanical shock.

FIG. 8 is a top view of one embodiment of the laser system of FIG. 7.

FIG. 9 is an end view of the embodiment of FIG. 8.

FIG. 13 illustrates one embodiment of a laser core.

FIGS. 14 and 15 show cross-section front and side views of an overlap area formed between a terminal and a conductive surface taken as is illustrated in FIG. 13.

FIGS. 16 and 17 depict cross-section and front views of an overlap area formed between a terminal and a conductive surface using the views used in FIG. 14 and in FIG. 15 and show a conductive mass therebetween.

FIGS. 21 and 22 are front and side views of an overlap area using the views used in FIGS. 14 and 15 and illustrate features used in another embodiment of a method of making a laser core.

DETAILED DESCRIPTION OF THE INVENTION

Figure 7:
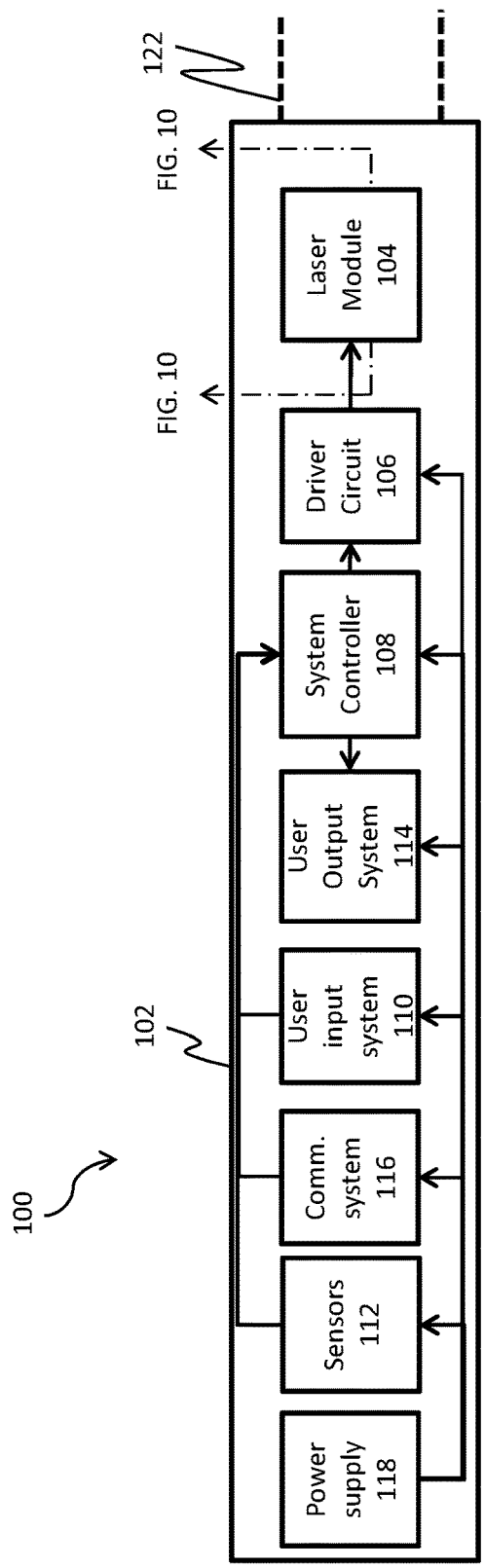
FIG. 7 is a schematic view of a first embodiment of a laser system.

FIG. 7 is a schematic view of a first embodiment of a laser system 100. FIGS. 8 and 9 illustrate respectively top and end views of the embodiment of FIG. 7. In the embodiment illustrated in FIGS. 7-9 laser system 100 has a system housing 102 that encompasses, substantially encloses, or otherwise retains, a laser module 104, a drive circuit 106, a system controller 108, a user input system 110, sensors 112, a user output system 114, a communication system 116, and a power supply 118.

In this embodiment, system controller 108 receives signals from user input system 110, sensors 112, and communication system 116 and determines whether a response to such signals is required. When system controller 108 determines to respond to received signals by causing a laser emission, system controller 108 sends signals to drive circuit 106 causing drive circuit 106 to supply electrical energy from power supply 118 to laser module 104 in a manner that causes laser module 104 to emit a laser beam 122. System controller 108 can also generate signals that cause user output system 114 to generate a human perceptible output. Additionally, system controller 108 can send signals to communication system 116 causing communication system 116 to send signals to other devices, to cause communication system 116 to receive signals from other devices or both. Power supply 118 provides electrical energy to drive circuit 106, system controller 108, user input system 110, sensors 112, user output system 114, and communication system 116. As is shown in FIGS. 7-9, in this embodiment system housing 102 provides an enclosure for each of the components of laser system 100 to provide a stand-alone device capable of laser emission.

System housing 102 can be formed of any of a variety of rigid materials such as composites, laminates, plastics or metals. In one configuration, system housing 102 can be formed of an extruded aluminum, thereby providing sufficient strength and good thermal transfer properties in a comparatively lightweight package.

System housing 102 can be fabricated or assembled in any of a variety of ways. In one embodiment, system housing 102 is machined such as by EDM (electrical discharge machining), assembled, or molded if composites, laminates, plastics or metals are employed for system housing 102. System housing 102 also can be fabricated using other conventional techniques including but not limited to additive assembly techniques.

In FIGS. 7-9, system housing 102 is shown having a generally cylindrical profile. However, in other exemplary embodiments, system housing 102 may be configured to provide surfaces that enable system housing 102 to be joined, fixed, held, mounted or otherwise positioned for movement with other devices such as hand-held weapon system 14 or to any of a variety of direct fire weapons such as handheld, side, and small firearms. Such firearms include, but are not limited to, pistols, rifles, shotguns, automatic arms, semi-automatic arms, rocket launchers and select grenade launchers, bows and cross-bows. In other embodiments, system housing 102 can be configured to mount any known dismounted or dismounted crew-served weapon, such as machine guns, artillery, recoilless rifles and other types of crew served weapons. Additionally, system housing 102 can be adapted for use in conjunction with other types of non-lethal weapon systems such as sonic devices, non-lethal weapon systems, and other such systems.

In still other embodiments, system housing 102 can be shaped, sized or otherwise provided in forms that more readily interface with any of a variety of clamping or mounting mechanisms such as a Weaver-style rail, a Picatinny rail, other dove tail engagement surfaces, or any other known mechanisms that can be used to mount laser module 104 to a firearm. In further exemplary embodiments, system housing 102 can be configured as a component part of a hand-held weapon system 12 or other direct fire weapon, such as a foregrip, sight or stock.

Drive circuit 106 receives power from power supply 118 and control inputs from system controller 108. In response to the control inputs received from system controller 108, drive circuit 106 generates signals that cause laser module 104 to emit laser light. In the embodiment that is illustrated in FIG. 7 laser module 104 is not directly connected to power supply 118 but rather receives power by way of drive circuit 106 such that drive circuit 106 can control the time, duration, modulation and intensity of electrical energy supplied to laser module 104. Drive circuit 106 may be configured to assist in tuning and/or otherwise controlling the output of laser module 104. Drive circuit 106 can be constructed to provide either pulsed or continuous operation of laser module 104. The rise/fall time of the pulse, compliance voltage and current generated by drive circuit 106 for the laser module 104 are selected to minimize power consumption and heat generation while achieving a desired beam intensity. These parameters may also be selected to cause laser module 104 to produce a beam having a desirable wavelength, frequency, and/or other quantifiable characteristics.

Depending on the desired output, drive circuit 106 can enable operation of laser module 104 as a continuous or pulsed laser, such as by passive, active, or controlled switching. Although specific values depend upon the particular laser module 104 and intended operating parameters, it is contemplated that in some embodiments the peak power draw of drive circuit 106 and/or laser module 104 may be between approximately 1 amp and approximately 10 amps, with an average current draw between approximately 0.1 amps and approximately 1.0 amps. As the required voltage may be between on average approximately 9 volts and approximately 12 volts, approximately 0.9 W to approximately 12 W may be consumed. This may represent a substantial power consumption as well as heat generation.

In an exemplary embodiment, drive circuit 106 may assist in controlling, modulating and/or modifying the power level of laser module 104 to aid in penetrating components or conditions of the atmosphere through which laser system 100 will direct laser beam 122. Such components or conditions may include, for example, snow, rain, fog, smoke, mist, clouds, wind, dust, gas, sand, and/or other known atmospheric or airborne components. For example, drive circuit 106 can be configured to controllably, manually, and/or automatically increase the current and/or voltage directed to strengthen and/or intensify laser beam 122 emitted by laser module 104 in such conditions.

It is also understood that laser module 104 can have more than one semiconductor laser (not shown in FIGS. 7-9). In one exemplary embodiment of this type, a laser module 104 can have one semiconductor laser in the form of a mid-range infrared light emitting quantum cascade laser and another semiconductor laser in the form of a long-range infrared light emitting quantum cascade laser. Other combinations of semiconductor lasers are possible.

Alternatively, in other embodiments, laser module 104 can include components that can receive signals from drive circuit 106 and that can adjust power supplied to laser module 104 in response to such signals. In such an alternative embodiment, laser module 104 may receive electrical energy directly from power supply 118.

In the embodiment illustrated in FIGS. 7-9 system housing 102 has plurality of openings shown as openings 120, 124, 126 and 128. In certain embodiments, seals 140, 142, 144, 146 can be supplied to provide a barrier to resist entry of contaminants at openings 120, 124, 126 and 128 so as to protect the components disposed within system housing 102 from water, dust, vapors, or other harmful contaminants found in non-controlled environment use. Optionally, system housing 102 can be hermetically sealed, at least in part around laser module 104.

User input system 110 includes human operable sensors such as switches, touch pads, touch screens, touch screens, joysticks, audio sensors, light sensors, video sensors, capacitive touch sensors, resistive touch sensors, keypads, key locks, proximity sensors or any other known types of sensors that can detect a user input action and that can provide signals to system controller 108 indicative of the user input action. In the embodiment of FIGS. 6-8, user input system 110 provides a switch 130 that takes the form of a four position mode switch with different settings to enable manual selection of three different operating mode selections and an off selection.

Sensors 112 can include any form of device that can be used to detect or otherwise sense conditions inside or outside of system housing 102 that may be useful to system controller 108 in determining actions to be taken in operating laser system 100. Sensors 112 can include without limitation, light sensors such as photovoltaic cells, contact switches, opto-electronic sensors such as light beam emitter and sensor pairs, electro-mechanical sensors such as limit switches, strain sensors, and proximity sensors such as Hall effect sensors, thermal sensors, meteorological sensors, such as humidity sensors, accelerometers, orientation sensors and other known sensors and transducers.

User output system 114 can include, without limitation actuators, light emitters, video displays, or other sources of human perceptible visual, audio or tactile signals from which a user can determine for example, and without limitation, a status of laser system 100, an operating mode of laser system 100, or that laser system 100 is emitting a laser beam 122 and a characteristics of the laser beam 122 that laser system 100 is emitting or will emit when instructed to do so. In this embodiment, user output system 114 includes a video display 132 that is positioned in opening 128.

Communication system 116 can include any combination of known communication circuits including wired or wireless transponders, transceivers, transmitters, receivers, antennas, modulators, de-modulators, encryption and de-encryption circuits or software and can provide other known components to facilitate data communication, the exchange of control signals or power exchanges in wired or wireless form.

Power supply 118 is shown located within system housing 102. In one configuration, power supply 118 comprises a battery and system housing 102 can include a battery compartment (not shown) sized to operably receive and retain a power supply 118 in the form of batteries. Depending upon the anticipated power requirements, available space, and weight restrictions, the batteries can be N-type batteries or AA or AAA batteries. Additionally, a lithium/manganese dioxide battery such as military battery BA-5390/U, manufactured by Ultralife Batteries Inc. of Newark, N.Y. can be used with laser system 100. The battery-type power supply can be disposable or rechargeable. Battery compartment can be formed of a weather resistant, resilient material such as plastic, and shaped to include receptacles for receiving one or more batteries or other power storage devices. Further, the battery compartment may be selectively closeable or sealable to prevent environmental migration into the compartment or to create a hermetically sealed environment therein.

In other exemplary embodiments, power supply 118 can take the form of a fuel cell, capacitive system or other portable electrical energy storage or generation system. It is understood that any type of power supply 118, preferably portable and sufficiently small in size can be utilized.

As is noted above, system controller 108 drives operation of laser system 100 and receives signals from user input system 110, sensors 112 and communication system 116 that system controller 108 can use to control operation of laser system 100. System controller 108 comprise for example a computer, a microprocessor, micro-controller, programmable analog logic device or a combination of programmable or hardwired electronic devices capable of performing the functions and actions described or claimed herein.

In the embodiment of FIGS. 7-9 system controller 108 determines a mode of operation of laser system 100 in response to a position of switch 130. When switch 130 is positioned in the "Off" position, user input system 110 sends signals to system controller 108 causing system controller 108 to remain in an inactive state or can maintain a low power consumption mode of operation.

However, when system controller 108 receives signals from user input system 110 indicating that switch 130 has been moved to the "On" position system controller 108 can generate signals causing drive circuit 106 to drive laser module 104 to generate a laser light. In other embodiments, switch 130 can comprise a switch that provides power to initiate operation of system controller 108 only when switch 130 is in a position other than the "Off" position.

Other modes of operation are possible. For example a "Stand By" mode of operation can be provided to conserve stored energy of from power supply 118 while maintaining the laser system 100 in an advanced state of readiness for use. In this example, system controller 108 determines that the "Stand By" mode of operation has been selected when system controller 108 determines that switch 130 has been moved to the "Stand By" position.

In one embodiment, system controller 108 can detect that switch 130 has been moved to the "Stand By" position and can respond to this by sending signals to drive circuit 106 causing drive circuit 106 to begin supplying power to circuits or subsystems, if any, that require some time to reach a state where they are ready for immediate activation when switch 130 is moved to the "On" position. Not all circuits or subsystems will need be activated at such times and a stand by option relieves the operator from being confronted with the choice of operating the laser system 100 in a high power consumption "On" mode prior to the need to do so and the choice of holding the device in the "Off" state to conserve power with the understanding that there will be a lag time before activation.

Additionally, in the embodiment of FIGS. 7-9 switch 130 can be positioned at a location that indicates that laser system 100 is to be operated in a "Test" mode. In one example of this type, system controller 108 can cause laser module to emit a lower powered laser beam 122. This lower powered laser beam can 122 be used to allow verification of the operational status of laser system 100 such as by emitting a lower powered laser test beam that can be directed at, for example, nearby targets for training purposes or at target strips or pages that change in appearance when illuminated by the laser in the test mode. Here too, this mode will be entered when system controller 108 receives a signal from user input system 110 indicating that switch 130 has been moved to a position selecting the "Test" mode.

Figure 10:
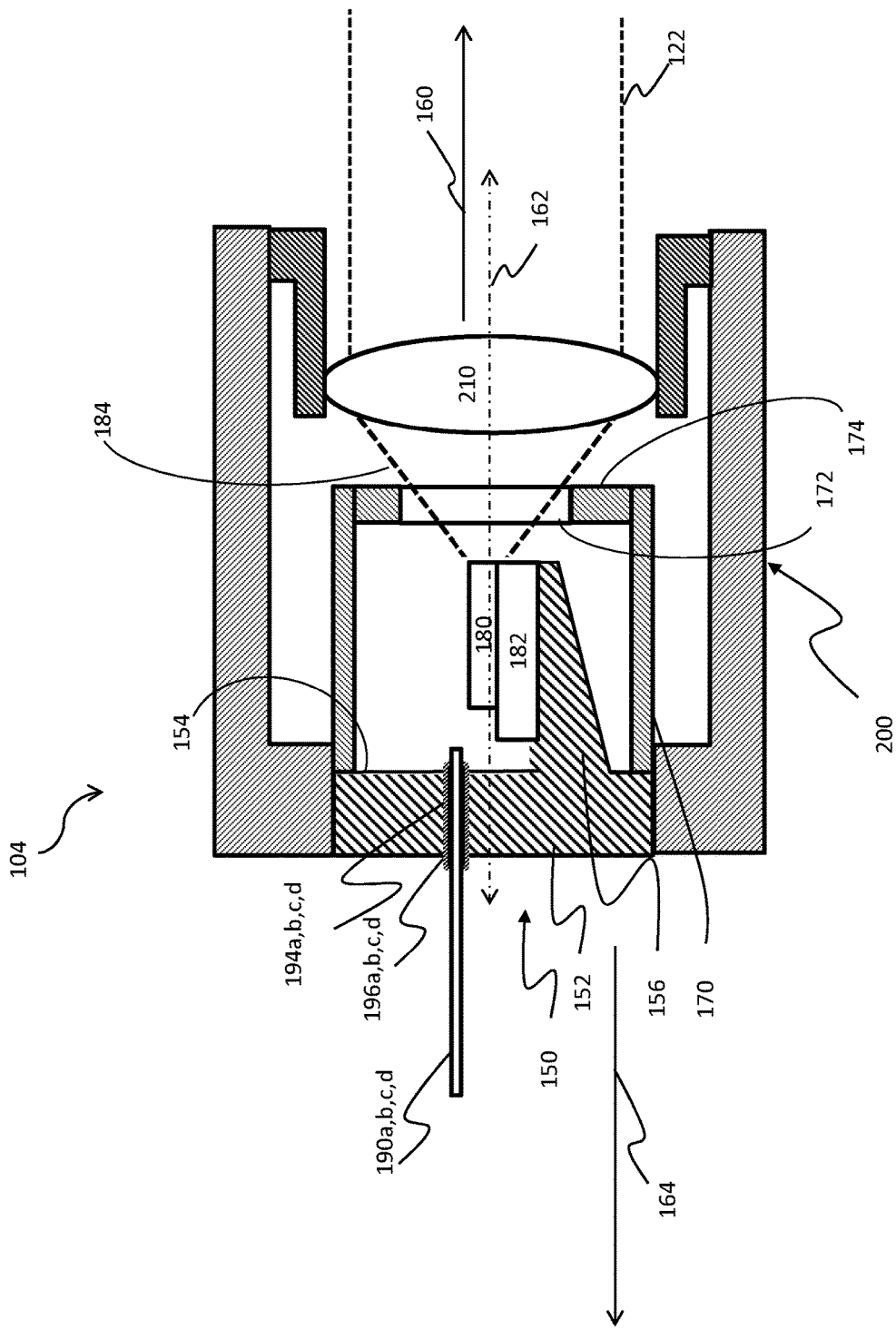
FIG. 10 is a side section of the embodiment of FIGS. 7-9.

Turning now to FIG. 10 what is shown is a cross-section schematic view of one embodiment of a laser module 104 taken as shown in FIG. 7. In the embodiment that is illustrated in FIG. 10, laser module 104 has a laser core 150 with a base 152 having a front side 154 from which a stem 156 extends in a first direction 160 and a housing 170 shaped to combine with front side 154 to form a sealed environment about stem 156.

A semiconductor laser 180 is mounted to stem 156. In this embodiment, semiconductor laser 180 is mounted to stem 156 by way of a submount 182 and is positioned to direct a divergent laser light 184 in first direction 160 through a window 172 on a front portion 174 of housing 170. Semiconductor laser 180 or submount 182 can be joined to stem 156 in any of a variety of ways including conventional fasteners, solders, conductive adhesives and the like. Semiconductor laser 180 in turn is typically bound to submount 182 using soldering techniques, although other techniques are also known.

Semiconductor laser 180 can comprise for example, any semiconductor device that can emit a laser output. Examples of semiconductor laser 180 include but are not limited to a diode laser, quantum cascade lasers, inter-band cascade lasers. These types of semiconductor lasers 180 share generally the characteristics of being made from a semiconductor material that emits a divergent laser light beam while also generating a meaningful amount of heat that must be dissipated to protect semiconductor laser 180.

Figure 1:
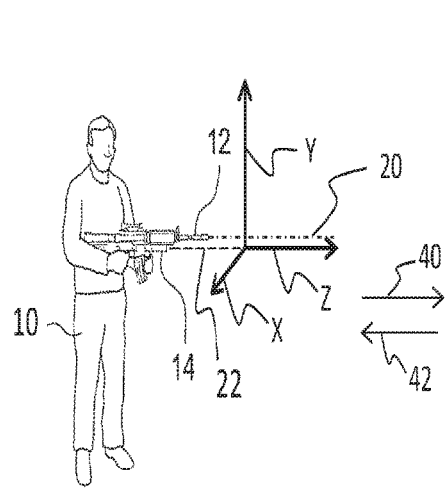
FIG. 1 is a side elevation view of a person with a prior art hand held weapon system having a laser device.
Figure 2:
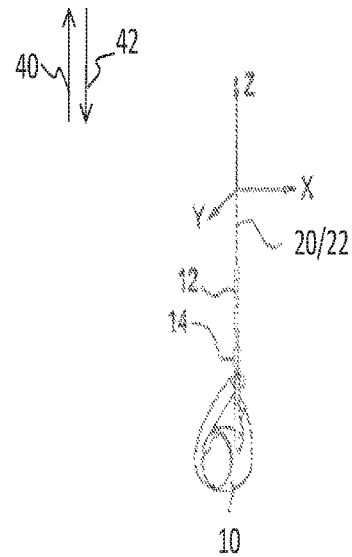
FIG. 2 is a top view of a person with a prior art hand-held weapon system having a laser device.
Figure 3:
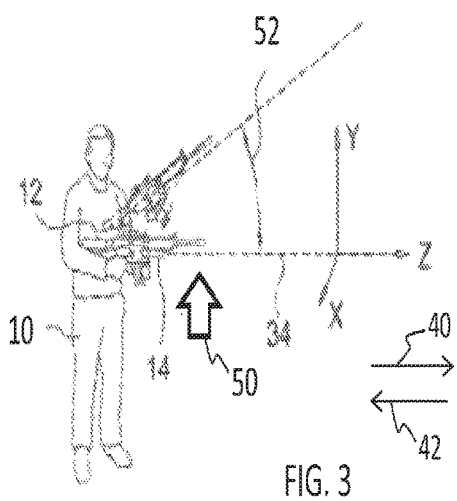
FIG. 3 is a side elevation view of a person with a prior art hand-held weapon system having a laser device after discharge.
Figure 4:
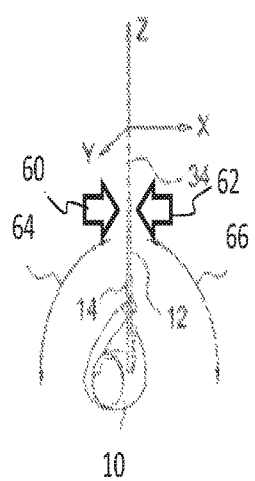
FIG. 4 is a top view of a person with a prior art hand-held weapon system having a laser device after discharge.

In the embodiment illustrated in FIG. 10, semiconductor laser 180 emits a divergent laser light 184 having a wavelength in the infrared region such as between 2µ and 30µ wavelength. However, in other embodiments, semiconductor laser 180 can emit a divergent laser light 184 having any of a wide range of wavelengths including but not limited to ultraviolet wavelengths, visible wavelengths, and near infrared wavelengths. For the purposes of the following discussion, it will be assumed that in the embodiment of FIG. 3, semiconductor laser 180 is a quantum cascade type laser.

A frame 200 is joined to base 152 and extends from base 152 past window 172 to position a lens 210 at a distance along axis 162 from semiconductor laser 180. In operation, semiconductor laser 180 generates a divergent laser light 184 which is directed toward lens 210. Lens 210 controls divergent laser light 184 emitted from semiconductor laser 180 to form a laser beam 122 having controlled characteristics when lens 210 is positioned at a location where lens 210 can effectively focus light from semiconductor laser 180. In one embodiment, the characteristic that is controlled can be used herein a collimated laser beam 122 includes a laser beam that is fully collimated as well as laser beams having substantial collimation with a controlled divergence.

In general, lens 210 can provide a high degree of collimation of divergent laser light 184 if held within a range of positions relative to its focal distance from semiconductor laser 180. However, in practical use this is difficult to achieve with a static lens mounting design. In particular it will be understood that a variety of forces can conspire to influence the distance that a mechanical system such as frame 200 will position lens 210. Chief among these are the forces of thermal expansion and contraction which can cause significant changes in the length of components of frame 200 and the resultant position of lens 210 relative to semiconductor laser 180.

A frame 200 is optionally of an athermalized design meaning that frame 200 is designed so that frame 200 will hold lens 210 in a desirable range of positions relative to semiconductor laser 180 despite any thermal expansion or contraction of any components of frame 200 that may arise during transport and operation of laser system 100. Such systems do not seek to completely resist or prevent heating or cooling of frame 200, but rather are defined to provide mechanisms to allow for automatic compensation for any thermal expansion caused by such heating or cooling.

Figure 11:
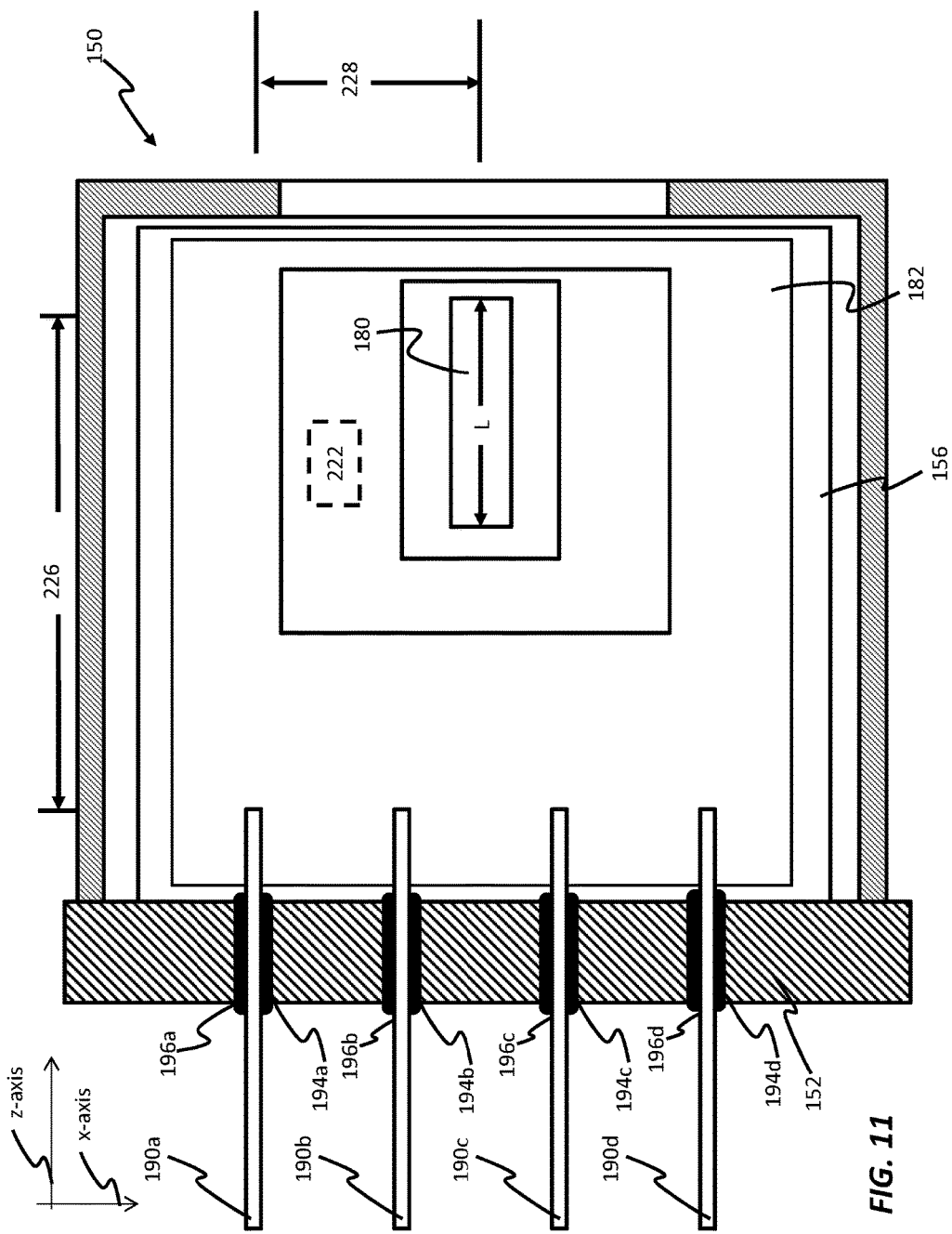
FIG. 11 is a top view of a laser core without a transmission circuit.

FIG. 11 shows a top view of a laser core 150 of the embodiment of FIG. 10. As is shown generally in the embodiment of FIG. 10 and in the top view of FIG. 11 terminals 190a, 190b, 190c and 190d extend through electrically insulative seals 196a, 196b, 196c and 196d at openings 198a, 198b, 198c and 198d to allow electrical signals and power to travel into and out of laser core 150. Terminals 190a, 190b, 190c and 190d can be used to allow an electrical linkage between electrical circuits of laser system 100 outside of laser core 150 and semiconductor laser 180, an optional sensor 222 and any other electrical components, circuits or systems that are located within laser core 150. One example of such a system that may be located within laser core 150 is a thermoelectric cooler (not shown). However, this example is not limiting.

Accordingly, a transmission circuit is required (not shown in FIGS. 10 and 11) to join terminals 190a, 190b, 190c and 190d to semiconductor laser 180, optional sensor 222 and any other components in laser core 150. In the embodiment of FIGS. 10 and 11, portions of semiconductor laser 180 are positioned apart from terminals 190a, 190b, 190c and 190d by as much as a first distance 224 along first direction 160 and by as much as a second distance 226 along a second direction 228. For the reasons discussed above, bridging such a distances with one or more conventional wire bonds is difficult to do particularly when it is required that such wire bonds must be able to survive higher order transient accelerations and, in particular, repeated higher order transient accelerations. This task becomes substantially more challenging in applications where there are limits on the size, weight and complexity of the laser system 100, laser module 104 or laser core 150.

Figure 12A:
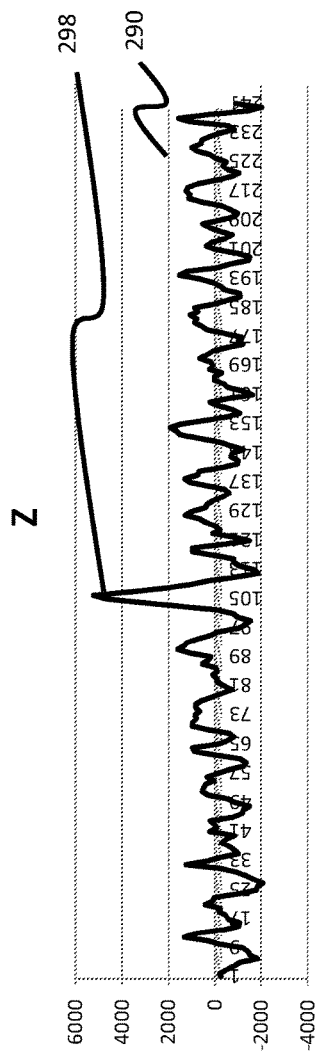
FIG. 12A is a plot of a hypothetical Z-axis accelerations experienced at a laser module during a transient higher order acceleration event.
Figure 12B:
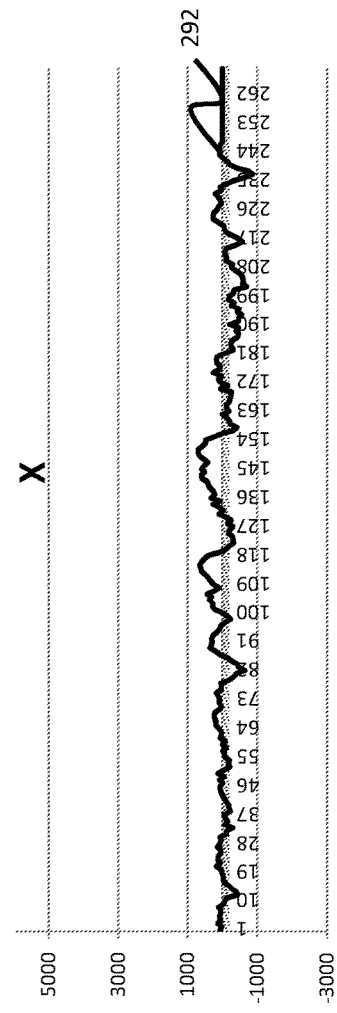
FIG. 12B is a plot of a hypothetical x-axis accelerations experienced at a laser module during the transient higher order acceleration event of FIG. 12A.
Figure 12C:
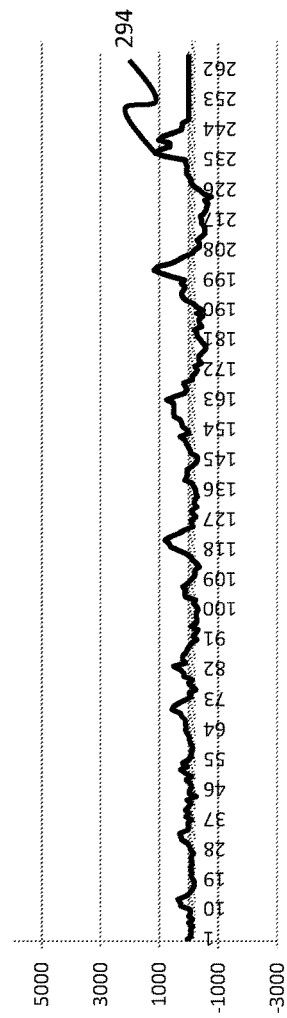
FIG. 12C is a plot of a hypothetical y-axis accelerations experienced at a laser module during the transient higher order acceleration event of FIG. 12A.

However, the present inventors have discovered that in many of the applications of such laser modules 104 higher order transient accelerations that can threaten the integrity of conventional wire bond arrangements occur primarily along certain directions or axes relative to such laser modules 104. For example, FIG. 12A illustrates plot of accelerations at a laser module representing hypothetical z-axis accelerations 290, while FIG. 12B illustrates hypothetical y-axis accelerations 292 and FIG. 12C represents hypothetical x-axis accelerations 294 that a laser module 104 may be exposed to during discharge of a hand-held weapon system such as hand-held weapon system 12 illustrated in FIGS. 1-4. As is shown in FIGS. 12A-12C in this hypothetical example laser module 104 experiences a highest transient acceleration 298 along the z-axis which for example can be aligned with the direction along which a projectile is emitted from hand-held weapon system 12. In contrast, laser module 104 also experiences generally lower order accelerations along y-axis and along x-axis.

FIGS. 13-17 illustrate a first embodiment of a laser core 150 that can provide improved resistance to higher order transient accelerations as well as other performance advantages. In the embodiment of FIGS. 13-17, laser core 150 has a laser 180 that is positioned by a stem 156 that extends from a base 152.

In the embodiment that is illustrated here, laser 180 is shown joined to stem 156 by way of a submount 182. Submount 182 is generally nonconductive. A conductive pad 230 is positioned between a lower surface (not shown) of laser 180 and extends generally around laser 180 to provide an area of conductive material about laser 180. Electrical energy is supplied to laser 180 by way of electrical contacts made with upper surface 182 and with conductive surface 230 disposed between laser 180 and stem 156 and a transmission circuit 250 is positioned apart from stem 156 by electrically insulative surface 252.

Laser 180 has an upper surface 214 and a lower surface (not shown) and emits laser light 184 when current to flows between upper surface 214 and lower surface and in this embodiment a laser electrical path is provided that extends from terminals 190c and 190d to conductive surface 230 and upper surface 214 respectively.

In the embodiment of FIGS. 13-17, electrical connections between laser core 150 and other components of laser system 100 are provided by way of electrically conductive terminals 190a, 190b, 190c and 190d that pass through electrically insulative seals 196a, 196b, 196c and 196d in openings 194a, 194b, 194c and 194d of base 152. As is shown in this embodiment, openings 194a, 194b, 194c and 194d and electrically insulative seals 196a, 196b, 196c and 196d are arranged so that electrically conductive terminals 190a, 190b, 190c and 190d extend generally along the same axis as an axis of laser emission.

Transmission circuit 250 has electrically conductive paths 260a, 260b, 260c and 260d each with a conductive surface 262a, 262b, 262c and 262d. Conductive surfaces 262a, 262b, 262c and 262d and terminals 190a, 190b, 190c and 190d are arranged so that terminals 190a, 190b, 190c and 190d extend from electrically insulating seals 196a, 196b, 196c and 196d on paths that overlap at least parts of conductive surfaces 262a, 262b, 262c and 262d.

FIGS. 14 and 15 provide cross-sectional illustrations of an overlap area 280a formed between a terminal 190a and a conductive surface 262a taken as is illustrated in FIG. 13. As is shown in FIGS. 14 and 15, an overlap area 280a is defined generally by an overlap length 282a, an overlap width 284a and a separation distance 286a between terminal 190a and conductive surface 262a.

In the embodiment of FIGS. 13-17, terminals 190a, 190b, 190c and 190d are joined to conductive surfaces 262a, 262b, 262c and 262d by conductive masses 270a, 270b, 270c and 270d of an electrically conductive material. Conductive masses 270a, 270b, 270c and 270d can provide a generally continuous electrical connection between terminals 190a, 190b, 190c, and 190d and conductive surfaces 262a, 262b, 262c and 262d or can otherwise provide good continuity and low resistance to current flow between terminals 190a, 190b, 190c and 190d and conductive surfaces 262a, 262b, 262c and 262d.

Conductive masses 270a, 270b, 270c and 270d can provide a cross-sectional area that is significantly larger than the cross-sectional area of a conventional wire bond. This larger cross sectional area offers a number of advantages. For example, the large cross section of conductive masses 270a, 270b, 270c and 270d also enables conductive masses 270a, 270b, 270c and 270d to survive shear forces created by higher order transient accelerations along the x-axis and along the z-axis.

Additionally, the large cross-sectional area of the conductive masses 270a, 270b, 270c, and 270d can reduce the overall electrical resistance between terminals 190a, 190b, 190c, and 190d and conductive surfaces 262a, 262b, 262c and 262d allowing laser system 100 to operate with greater efficiency. Additionally, it will be appreciated that the greater resistance of conventional wire bonds can also generate more Ohmic heating when conveying a particular current than the less resistive solid masses 270a, 270b, 270c, and 270d and that any heat introduced in a chamber with a laser 180 or other semi-conductor can increase a heat dissipation load of the overall laser system. Thus in some embodiments, for example, overlap area 280a is sized larger than is necessary to provide a shear strength that is greater than a shear force created by an anticipated higher order acceleration and additionally the size of overlap area 280a is determined at least in part to provide a conductive mass that has an electrical resistance that is below a predetermined electrical resistance A further advantage of a large cross-sectional area of the conductive masses 270a, 270b, 270c, and 270d can increase the thermal conductivity between terminals 190a, 190b, 190c, and 190d and conductive surfaces 262a, 262b, 262c and 262d to a level of thermal conductivity that is above a predetermined level of thermal conductivity. This in turn provides a greater opportunity for thermal energy generated within laser core 150 to more efficiently transfer out of core 150 and into components that are connected to terminals 190a, 190b, 190c, and 190d.

In one example of this type, overlap area 280a is sized larger than is necessary to provide a shear strength that is greater than a shear force created by an anticipated higher order acceleration and additionally the size of overlap area 280a is determined at least in part to provide a conductive mass that has a thermal conductivity that is above a predetermined thermal conductivity. In the embodiment of FIGS. 13-17 the cross-sectional area of conductive mass 270a is determined generally by overlap length 282a and overlap width 284a. Overlap length 282a can for example be between about 1.0 and 5.0 mm and in other examples between about 1.0 and 15.0 mm. Overlap length 282a can have other lengths as may be appropriate for geometries within a particular design of laser core 150.

Overlap width 284a can be for example between about 0.3 mm to about 2.0 mm in median cross-section along the direction of an anticipated shear force or in average cross-section along the direction of an anticipated shear force. Width 284a can have other dimensions as may be appropriate for geometries within a particular design of laser core 150.

Projection length 191a can for example extend from between about 0.3 mm to about 5 mm from base 152.

However, projection length 191a can have other lengths as may be appropriate for geometries within a particular design of laser core 150.

Similarly, contact surface 263a can have a contact length of 291a that extends about 0.3 mm to about 5 mm and can be greater or less than projection length 191a. However, contact length 291a can have other lengths as may be appropriate for geometries within a particular design of laser core 150.

In the embodiment of FIGS. 13-17, overlap area 280a is sized so that solid mass 270a has a shear strength that is greater than a shear stress created at conductive mass 270a by a shear force from an anticipated higher order transient acceleration. As is noted above, in part this is accomplished through the use of an overlap area 280a having a cross-sectional area that attenuates the shear force, and in part this is accomplished through the shear strength inherent in conductive mass 270a.

For example, in one embodiment conductive mass 270a can be formed using a solder such as a tin-gold lead free solder. One example of such as solder is a Sn-3.5 Au lead free solder having a shear strength of about 55 MPa over an area that is about 29.7 millimeters square. Where such a solder is used to form connected mass 270a having a cross section of, for example, 3 square millimeters, the shear strength of such a conductive mass is about 5.5 MPa, This enables conductive mass 270a to resist shear forces that are about 16.5 kN.

Conductive mass 270a can also be sized to have a conductor bond strength between conductive mass 270a and conductive surface 262a and a contact bond strength between conductive mass 270a and terminal 190a that also have a shear strength that is greater than a shear force of an expected higher order transient acceleration. Here too, the cross-sectional area of conductive mass 270a allows greater surface area for bonding and increased ability of such bonds to survive exposure to shear forces created by higher order transient accelerations.

Additionally in some embodiments overlap area 280a is sized so that conductive mass 270a will provide a predetermined level of fracture toughness, or resistance to propagation of an existing flaw such as a crack, fissure, void or metallurgical inclusion in conductive mass 270a. Here, too the size of overlap area 280a and therefore the cross-sectional area of conductive mass 270a can be defined so that conductive mass 270a has a cross-sectional area along the direction of an anticipated shear force that helps to reduce the extent to which any such flaw will propagate within conductive mass 270a when conductive mass 270a is exposed to a shear force caused by a higher order transient acceleration.

It will be appreciated therefore that using conductive masses 270a, 270b, 270c and 270d to link terminals 190a, 190b, 190c, and 190d to conductive surfaces 262a, 262b, 262c, and 262d reduces the risks of unwanted interaction between wire bonds and unanticipated failures of wire bonds in a laser core that is exposed to higher order transient accelerations. Further, conductive masses 270a, 270b, 270c and 270d can also provide electrical, thermal and fracture toughness advantages.

Another advantage offered by the use of a conductive mass 270a is that a conductive mass 270 allows the space required for electrical connections to be made within laser core 150 to be reduced as compared to the space required to allow conventional wire bonding techniques to be used to make such wire bonds.

For example, when conventional wire bonding techniques are used, as in the prior art example shown in FIGS. 5 and 6, a wire bond between a first surface and a second surface often must typically traverse a path along at least two and possibly three different axes. To do this conventional wire bond forming equipment must be able to translate within the laser core along all necessary axes without damaging laser, electronic components, or other wire bonds. This in turn requires that the either or both of the x-axis dimension and the z-axis dimension of laser core 150 be expanded to include space for such lateral translation of wire bond making gear.

Such a result is not consistent with the ongoing desire of laser manufacturers to make laser modules and laser cores that are of small size.

However, as is shown here, the use of conductive masses 270 to bridge overlap areas 280 between a terminal 190 and a conductive pad 262 allows terminals 190a, 190b, 190c, 190d and conductive surfaces 262a, 262b, 262c and 262d to occupy overlapping space within laser core 150 such that the overall size of laser core 150 can be reduced as compared to a prior art laser core design of the type illustrated in FIGS. 5 and 6.

In embodiments, the use of conductive masses 270 to bridge overlap areas 280 between a terminal 190 and the conductive pad 262 further allows ready customization of a common laser core 150 that can be modified to provide more or less shear strength, mounting strength, electrical conductivity, or fracture toughness as may be desired in individual applications of laser core 150.

This can be done for example, by increasing a projection length 191a of terminal 190a or by increasing contact surface length 263a of contact surface 262a confronting terminal 190a or both.

In other embodiments, two laser cores 150 can be provided that differ only in the widths 284 of the terminals 190 used therein, with one of the laser cores having terminals 190 with the wider widths providing a greater extent of attenuation of the shear forces. This allows for greater customization of a laser core 150 for use in different types of applications without requiring a substantial redesign of laser core 150 to include shock compensation features.

In another example of this, two laser cores 150 of otherwise identical design can be used in a first application that will expose a laser core 150 to a lower range of higher order accelerations such as accelerations related to small arms fire and in a second application that will expose laser core 150 to a higher range of higher order accelerations such as accelerations related to cannon fire by extending overlap length 282a so that a conductive mass 270a for laser cores 150 used in the latter application will have sufficient shear strength to resist the higher transient accelerations associated with cannon fire beyond the extent of an overlap length 282a used with laser cores 150 designated for use in small arms applications.

Such embodiments allow a terminal 190a of a terminal width 284a and a conductive mass 270a of a known shear strength per unit area to be used both in applications that will be exposed to a relatively lower level of higher order accelerations and in applications that will be exposed to a relatively higher level of higher order accelerations. In practice, this allows greater design freedom by allowing a simple design adjustment to be made rather than requiring, for example, the use of different materials to form conductive masses 270a.

Alternatively, the ability to adjust overlap length 282a can be used for other purposes such as allowing lower cost or lighter weight materials to be used to form conductive mass 270a that may not have sufficient electrical conductivity, shear strength, bond strength, or fracture toughness when used for forming conventional wire bonds.

It will be appreciated from the foregoing that the use of conductive masses 270a, 270b, 270c, and 270d therefore enables laser module 150 to provide a more compact, more resilient, and more flexible platform from which a family of laser cores customized capabilities can be provided.

As is used herein, unless stated otherwise, the term conductive is used with respect to a wire bond, a pad of any type, a bumped feature, a conductive mass, a trace or any other component principally to indicate electrical conduction capability.

Methods for Forming a Laser Core

Figure 18:
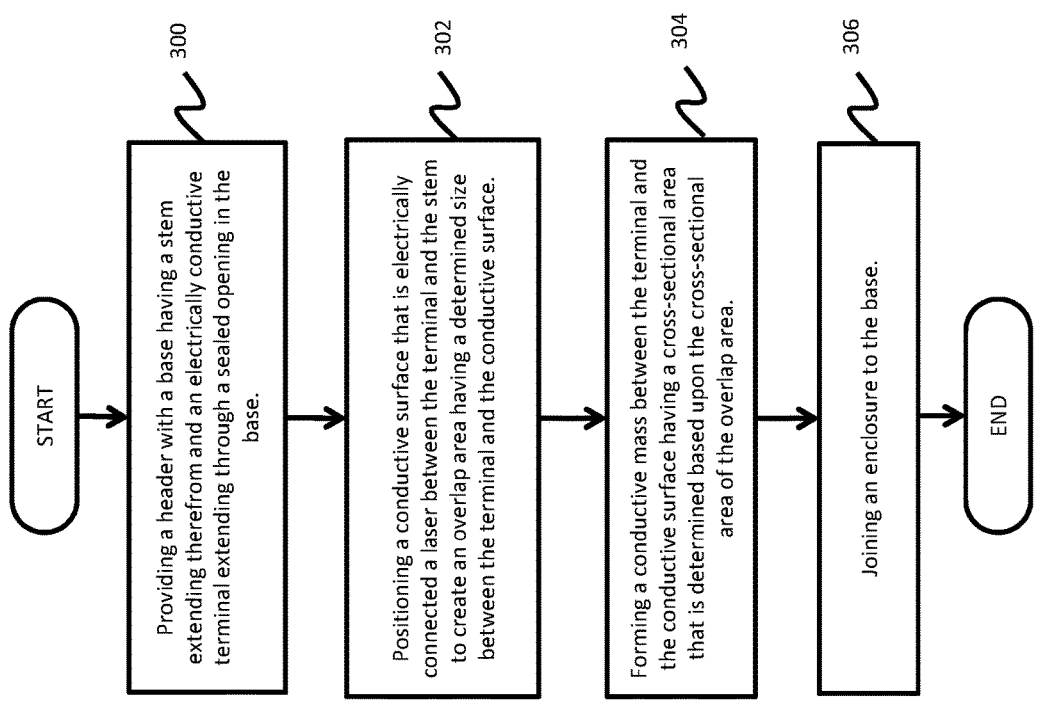
FIG. 18 illustrates a first embodiment of a method for making a laser core.

FIG. 18 illustrates a first embodiment of a method for making a laser core 150. In this embodiment, a header 151 is provided having base 152 with stem 156 extending therefrom and an electrically conductive terminal extending through a sealed opening in the base (step 300) and positioning a conductive surface that is electrically connected a laser 180 relative to stem 156 to create an overlap area between the terminal and the conductive surface having a determined size (step 302).

A conductive mass is formed between the terminal and conductive surface having a cross-sectional area that is based upon the determined size of the overlap area (step 304). In certain embodiments, base 152 may be designed for use with a co-designed enclosure that can be mounted to base 152 in order to provide a sealed environment within which laser 180 and other components of laser core 150 can operate and the method for forming such a laser core 150 can include the optional step of joining the base to an enclosure 161 (step 306).

Base 152 can be provided in any of a number of different fashions. For example, in some embodiments a base 152 can be acquired from commercial suppliers. For example, a base 152 can take the form of any of a variety transistor outline mounted high heat load laser packages sold by Schott North America, Southbridge, Mass., USA. In other embodiments it may be possible to use one of a variety of base 152 sold by HCC Aegis Inc., New Bedford, Mass.

Conventionally, such header packages include a base, terminals, a stem, and electrically insulative seals between the base and the terminals. Such commercially available headers 151 can be more readily obtained, typically offer reduced variability as compared to custom manufactured headers and in many cases the suppliers of such header packages provide options for customizing such headers for particular uses found in particular applications.

Alternatively, a header 151 can be provided by locally fabricating a base 152 with terminals 190 and insulative seals 196. Such fabrication can be performed in a variety of fashions such as by stamping, molding, or additive assembly processes.

As is generally illustrated in FIGS. 13-17, a conductive surface 262a that is electrically connected to a laser 180 is positioned between stem 156 and terminal 190a to create a sized overlap area 280a between terminal 190a and conductive surface 262a (step 302) and a conductive mass 270 is formed between terminal 190a and conductive surface 262a having a cross-sectional area that is based upon the size of overlap area 280a (304).

The size of overlap area 280a and, by extension, the size of the cross-sectional area of the conductive mass 270a is determined to allow a laser core 150 to be formed having desired functional characteristics. In general, the size of the cross-sectional area of conductive mass 270a can be the lowest cross sectional area of conductive mass 270a between terminal 190a and conductive surface 262a. Alternatively other measures can be used such as the median or average of the lowest ⅕ of cross sectional measurements.

For example, in some embodiments, an overlap area 280 can be sized so that a conductive mass 270 formed in an overlap area 280 has a cross-sectional area with a shear strength that is greater than a shear force created by an anticipated higher order transient acceleration. An overlap area 280a can also be sized so that a conductive mass 270a formed in the overlap area 280a will have a terminal bond strength between conductive mass 270a and terminal 190a that is greater than a shear force created by an anticipated higher order transient acceleration. Similarly, overlap area 280a can also be sized so that a conductive mass 270a formed in the overlap area 280a will have a conductive surface bond strength between conductive mass 270a and conductive surface 262a that is greater than a shear force created by an anticipated higher order transient acceleration.

Additionally, in other embodiments, the size of overlap area 280a further can be determined at least in part to so that a conductive mass 270a having an electrical resistance that is below a predetermined resistance. In some embodiments, the overlap area can be sized larger than is necessary to provide a shear strength that is greater than a shear force created by an anticipated higher order transient acceleration in order to allow the electrical resistance of the conductive mass 270 to be within a predetermined range.

In other embodiments, overlap area 280a has a size that is determined that is determined to allow a conductive mass 270a to have a cross-sectional area such that the conductive mass 278 has a predetermined range of resistance to reduce the risk of or the extent of propagation of an existing flaw including at least one of a crack, a fissure, a void or an unwanted inclusion in conductive mass 270. In some embodiments, this may require that the cross-sectional area of conductive mass 270 is greater than that necessary to provide resistance to the forces created by higher order transient accelerations.

In one embodiment, the step of forming a conductive mass (step 304) can comprise forming a solder bond between terminal 190a and conductive surface 262a. Conventional soldering techniques can be used to introduce solder between terminal 190a and conductive surface 262a during formation of conductive mass 270a.

In certain embodiments, flow of solder or other liquefied materials that can harden to form conductive mass 270a can be influenced by capillary action between the liquefied materials, the terminal and the conductive surface. In one example embodiment, terminal 190a and conductive surface 262a are separated by a separation distance that allows a flow of a conductive material between the terminal and the conductive surface such that the flow is at least in part influenced by capillary action. Similarly, at least one of conductive surface 262a and the terminal 190a can be defined to limit the extent of the capillary action influenced flow. The use of such capillary flow can, for example, advantageously allow a flow of a liquefied conductive material to be introduced at a single point in the overlap area, yet fill to occupy the area without requiring that the source of flow be moved or that multiple different sources be used.

In another embodiment, the step of providing a header (step 300) can include providing terminal 190a that is prefabricated with a solder material on a portion of terminal 190a that is within the overlap area and the step of forming a conductive mass (step 304) can comprise heating the solder material so that the material is softened or melts such that the solder material flows from terminal 190a onto conductive surface 262a to form a conductive mass 270a therebetween. Similarly, conductive surface 262a can be provided with a mass of solder material that can be heated to soften or melt so that terminal 190a can be bonded to solid mass 270a when terminal 190a is in contact with the conductive mass 270a.

Figure 19:
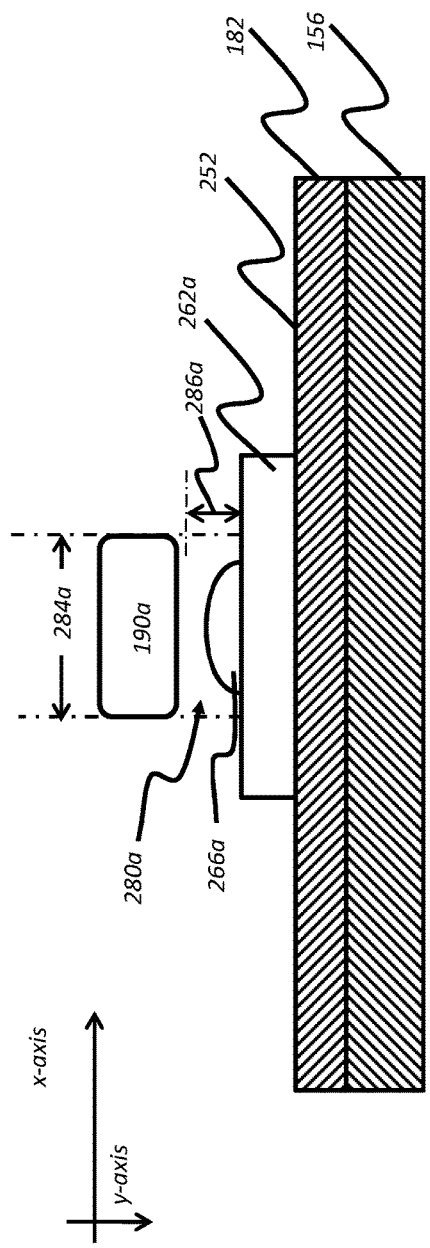
FIGS. 19 and 20 are front and side views of an overlap area using the views used in FIGS. 14 and 15 and illustrate features used in another embodiment of a method of making a laser core
Figure 20:
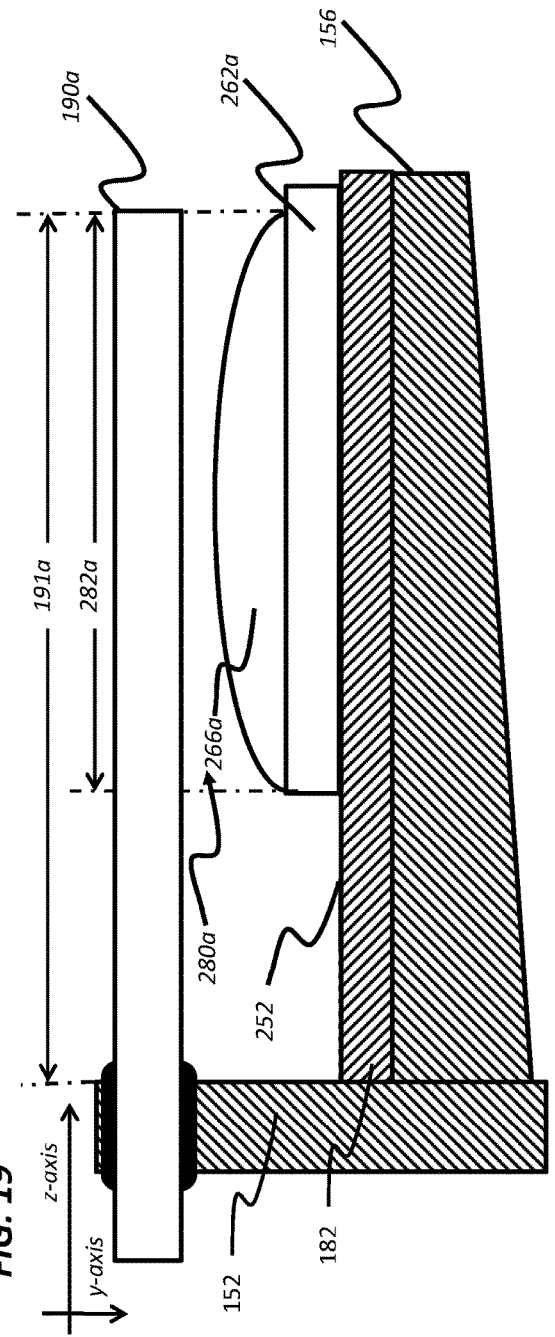

In still another embodiment, the step of positioning a conductive surface (step 304) comprises positioning a conductive surface 262a that includes supply of conductive material 266a positioned between conductive surface 262a and terminal 190a as is shown for example in FIGS. 19 and 20 which illustrate front and side views of an overlap area using the views used in FIGS. 14 and 15 and illustrating features used in another embodiment of a method of making a laser core. In this embodiment, the step of forming a conductive mass (step 304) comprises joining terminal 190a to supply of conductive material 266a using for example thermosonic welding or other such techniques known in the art and conductive material 266a forms conductive mass 270a thereafter.

A further embodiment is shown for example in FIGS. 21 and 22, which illustrate front and side views of an overlap area taken from the using the views used in FIGS. 14 and 15 and illustrating features used in another embodiment of a method of making a laser core. In this embodiment, a terminal 190a includes a supply of conductive material 266a in portions of terminal 190a. In this embodiment, conductive surface 262a is joined to conductive material 266a using for example thermosonic welding or other such techniques known in the art and conductive material 266a forms conductive mass 270 thereafter.

In still another embodiment conductive mass 270a can be made using conductive adhesives which could be for example and without limitation an epoxy, bismaleimide, silicone or other known types of adhesive binders having conductive filler materials. Such an adhesive binder can be for example and without limitation a thermoplastic or thermoset binder.

The conductive filler can be for example a conductive metal such as any noble metal, copper, or carbon, and known conductive forms of carbon or carbon-based composites and mixtures.

Such conductive adhesives can be applied using a variety of techniques to either or both of the terminal 190a and the conductive surfaces 262a using techniques such as dispensing, jetting, screen printing, stencil and printing. Using such techniques, such conductive adhesives can be applied in a predetermined pattern either to the terminal or to the conductive pad.

In the embodiment that is illustrated in FIGS. 13-17, laser module 104 is shown positioned on an electrically insulative surface 252 of a submount 182 and a transmission circuit 250 is provided having a plurality of conductive surfaces 262a, 262b, 262c and 262d each associated with one of terminals 190a, 190b, 190c and 190d. Transmission circuit 250 also provides electrical pathways between conductive surfaces 262a, 262b to and optional sensor 222 and electrical paths 260c and 260d between laser 180 and conductive surfaces 262c and 262d. In this embodiment, electrical paths 260c and 260d are provided on electrically insulative surface 252.

Figure 23:
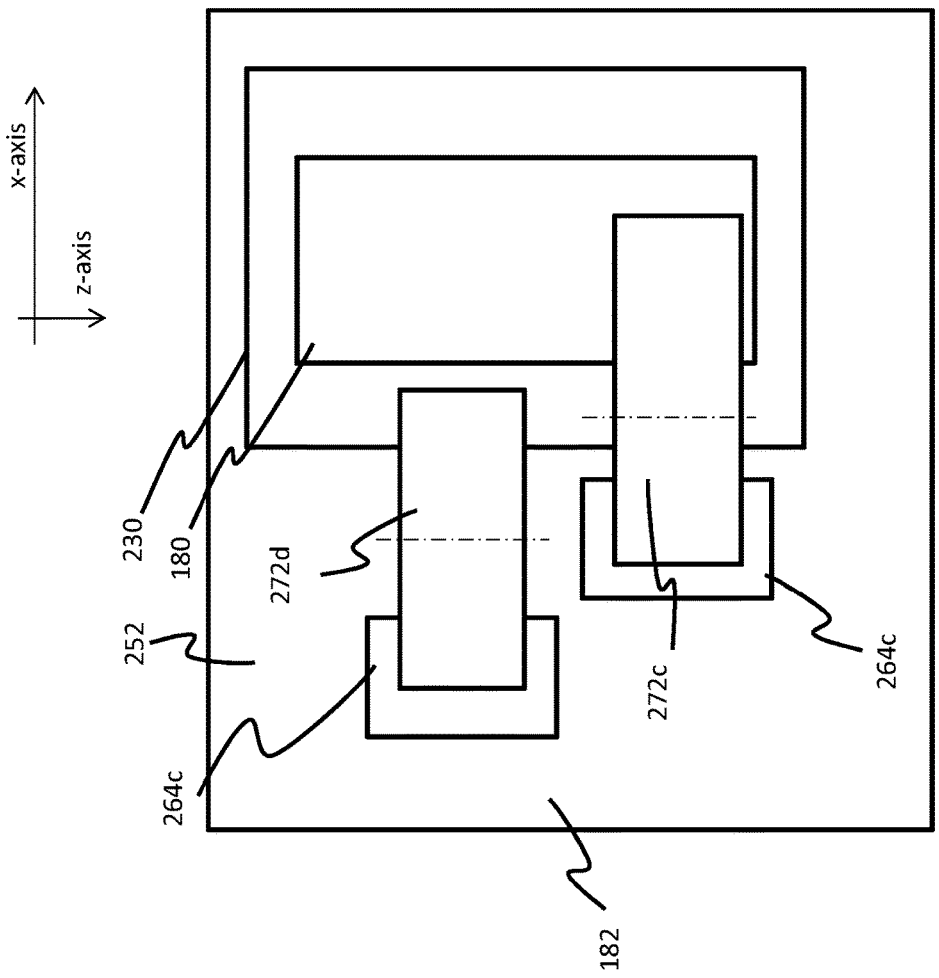
FIG. 23 illustrates the use of wire bonds to join to a terminal.

As is illustrated in a top view in FIG. 23, in such an embodiment, conductive surfaces such as conductive surfaces 262c and 262d, can for example be connected to terminal pads such as terminal pads 264c and 264d that are proximate to semiconductor laser 180 allowing short wire bond distances between conductive surfaces 262c and 262d and semiconductor laser 180 and a base 230 on which semiconductor laser 180 is mounted Such short distances can be bridged for example by short throw wire bonds 272c and 272d with lesser risk failure or unwanted interaction given the relatively short distances that wire bonds 272c and 272d must traverse and the lower mass of wire bonds 272c and 272d.

Figure 24:
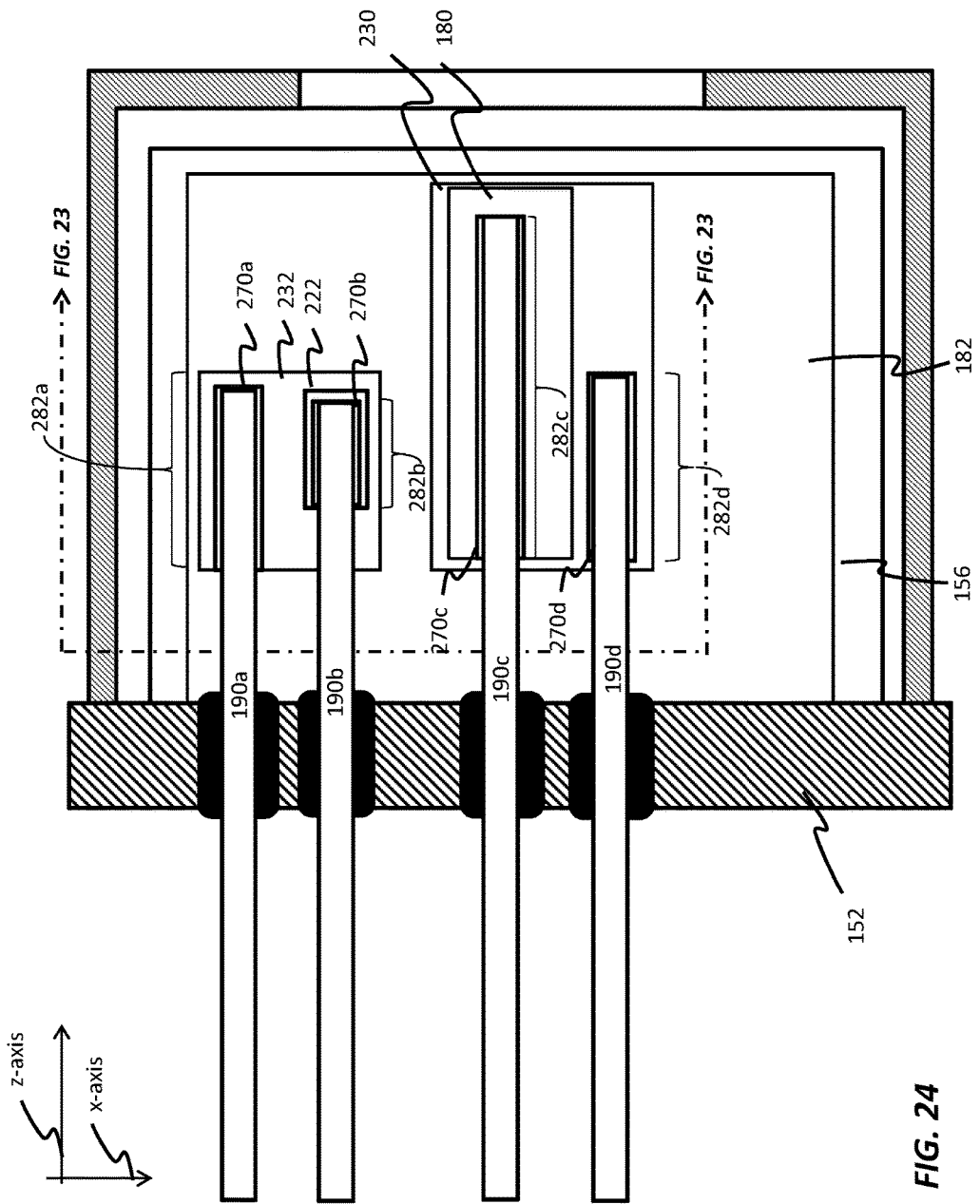
FIG. 24 shows a top view of another embodiment of a laser core and FIG. 25 shows the section view of FIG. 24.
Figure 25:
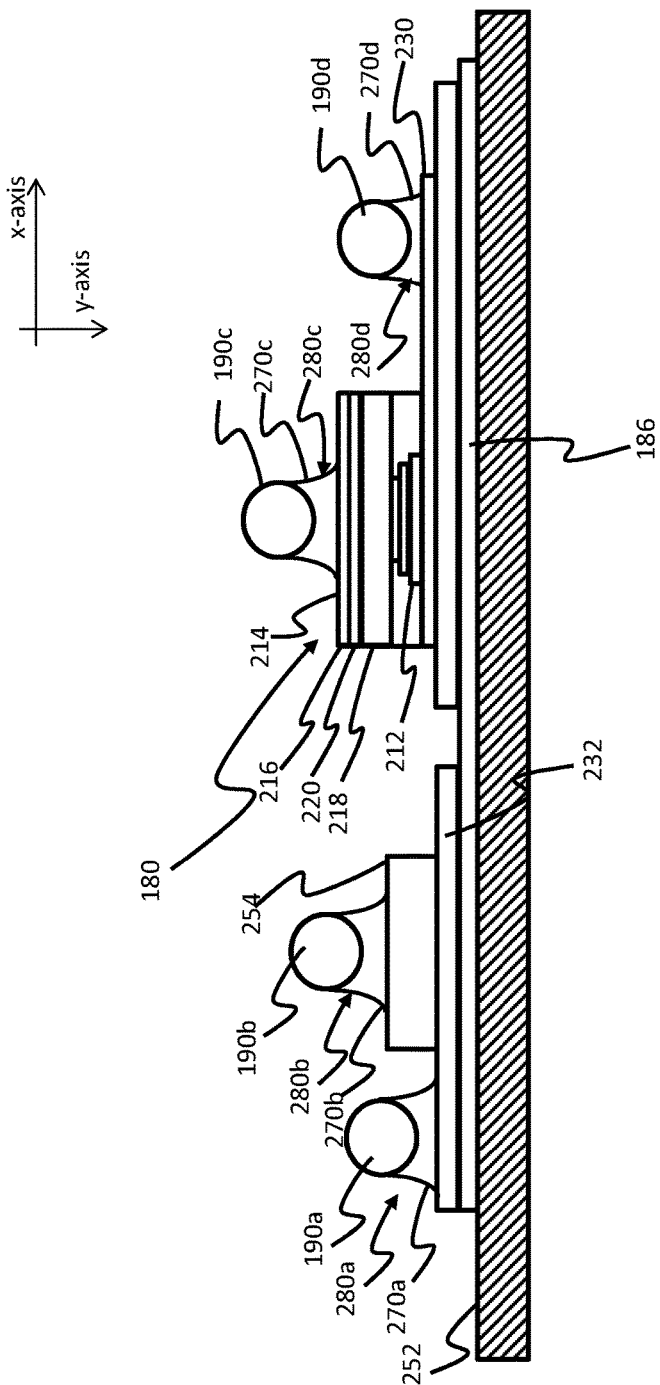

However, as is illustrated in a top view in FIG. 24 and in a cross-section view shown in FIG. 25, it is possible, using the techniques described herein to provide a laser module 150 having conductive masses 270a, 270b, 270c, and 270d that directly join terminals 190a, 190b, 190c, and 190 to semiconductor laser 180 to a photosensor 254 or other components of laser core 150.

For example, in the embodiment that is illustrated in FIGS. 24 and 25, semiconductor laser 180 is illustrated the form of a quantum cascade laser arranged in what is known as an "epi-down" arrangement, so that a laser gain medium portion of laser 180 is in contact with conductive pad 230 and a conductive substrate layer 218 is provided between laser gain medium portion 212 of laser 180 and an upper surface 214 and can comprise for example indium phosphate. In this embodiment upper surface 214 is conductive and can be for example and without limitation a gold layer. Optionally an intermediate substrate layer 220 can be deposited between upper surface 214 and conductive substrate layer 218 and can comprise germanium or titanium. Other embodiments and arrangements of a semiconductor laser 180 can be used.

Accordingly, in this embodiment, it is necessary to supply electrical energy to semiconductor laser 180 by providing electrical connections between terminals 190, upper surface 214, and conductive pad 230. Similarly, it is necessary to provide electrical connections between terminals 190, upper surface 214 and conductive pad 230 so that electrical signals generated or modulated by photosensor 254 can be sensed outside of laser module 150.

As is shown in FIGS. 24 and 25 in this embodiment terminal 190a overlaps conductive pad 230 by overlap length 282a to form overlap area 280a, while terminal 190b overlaps optional sensor 222 by overlap length 282b to form overlap area 280b, terminal 190c overlaps upper surface 214 of semiconductor laser 180 by overlap length 282c to form overlap area 280c and terminal 190d overlaps conductive pad 232 to form overlap area 280d.

As is also shown in FIGS. 24 and 25, conductive mass 270a is provided in overlap area 280a to provide an electrical connection between terminal 190a and conductive pad 232, a conductive mass 270b is provided in overlap area 280b to provide an electrical connection between terminal 190b and photosensor 254, a conductive mass 270c is provided in overlap area 280c to provide an electrical connection between terminal 190c and upper surface 114 of semiconductor laser 180 and conductive mass 270d is provided in overlap area 280d to provide an electrical connection between terminal 190d and conductive pad 230.

In this embodiment, as in the embodiments described above overlap areas 280a, 280b, 280c, and 280d can be defined in ways that enable the formation of conductive masses 270 having desirable electrical conductivity and resistance to shear forces caused by higher order transient accelerations. Additionally, such embodiments can be used to provide desirable thermal and fracture toughness characteristics.

Additionally as is illustrated in this embodiment, it becomes possible to reduce the overall z-axis length of laser core 150 as little separation is necessary between base 152 and overlap areas 280*a*, 280*b*, 280*c* and 280*d* and as electrical connections are formed in overlap areas 280*a*, 280*b*, 280*c* and 280*d* not in adjacent areas as is required by conventional wire bonding techniques.

An enclosure 161 is optionally then joined to base 152 (step 306). Enclosure 161 surrounds stem 156 to provide a controlled environment about laser 180, enclosed portions of terminals 190*a*, 190*b*, 190*c* and 190*d*, conductive surfaces 262*a*, 262*b*, 262*c*, and 262*d* and any other components positioned between enclosure 161 and base 152. Enclosure 161 has a path 163 for light generated by laser 180 to exit enclosure 161. The controlled environment can protect enclosed components from physical damage and environmental contaminants such as moisture, particulate matter, electrostatic discharge, or other conditions in the environment about laser core 150 that can cause damage to the enclosed components.

In other embodiments, other numbers of terminals 190 may be used. Additional connectors may be used to allow signals to pass to and from components within the enclosure formed by base 152, and enclosure 161, path 163, such as between base 152, housing 170 and window 172. This can be used for example to allow drive circuit 106 or system controller 108 receive signals from a sensing device such as a thermistor or other heat sensor or a photosensor so that drive circuit 106 or system controller 108 can determine the temperature near semiconductor laser 180 or the light output of semiconductor laser in order to enable feedback/control purposes. In still other embodiments, additional terminals 190 can be used as necessary to provide additional sensing, control, or power paths into and out of the enclosure made between base 152, enclosure 161 and path 163 such as between base 152, housing 170 and window 172.

It will be appreciated that in various embodiments, semiconductor laser 180 may comprise a semiconductor laser that generates a divergent laser light 184. By positioning a lens 210 so that laser light 184 strikes lens 210 after divergent laser light 184 reaches a larger diameter or area than an area of an alternative smaller focal length lens, the larger beam size of divergent laser light at lens 210 allows lens 210 to generate a collimated laser beam 122 having a lower divergence than is possible with an alternative smaller lens 211. In still other embodiments, lens 210 can be used to create a controlled divergent light such as light useful in illuminating an area.

In further exemplary embodiments laser system 100 can be combined with or integrated into other systems including but not limited to thermal viewing systems, surveillance systems, vehicles, robotic equipment, ships and aircraft all of which may be controlled manually or by way of automatic or control systems. In still other embodiments system housing 102 can be shaped and sized to mount to any of a variety of manned or unmanned vehicles used in surveillance, law enforcement, reconnaissance, target marking, friendly force marking, or combat applications. In exemplary embodiments, such vehicles can include, but are not limited to, any unattended ground sensors, self-righting camera balls, and other like portable devices.

In such exemplary embodiments, any and/or all components of laser system 100 may be integrally incorporated into such devices, and in such embodiments, the system housing 102, or portions thereof, may be omitted if desired. For example, in an embodiment in which laser system 100 is formed integrally with an unmanned ground vehicle, an unmanned aqueous vehicle, a mobile robot, an unattended ground sensor, or other like device, the components of the laser module 104 can be hermetically sealed within such devices and the system housing 102 may be omitted to reduce size, weight, space, power consumption, and/or drag associated with laser system 100. In such embodiments, one or more windows, lenses, domes, or other components may be employed proximate to facilitate emission of radiation from laser system 100.

Lens 210 has been shown as a single element lens. This has been done for simplicity. It will be appreciated that lens 210 can comprise any combination of optical elements capable of performing the functions described herein, including but not limited to diffractive or reflective elements.

As noted above, embodiments of semiconductor laser 180 can take the form of a quantum cascade laser or an interband cascade laser operable to produce a beam having a wavelength between approximately 1 µm and approximately 30 µm. In exemplary embodiments, the emitted beam may have a preferred wavelength between approximately 2 µm and approximately 5 µm, or between approximately 7 µm and approximately 30 µm. Although a single semiconductor laser 180 is shown in system housing 102, it is contemplated that a plurality of semiconductor lasers 180 can be disposed within the system housing 102, and in certain embodiments, some or all of semiconductor lasers 180 may emit radiation at different respective wavelengths. In additional exemplary embodiments, a single semiconductor laser 180 can be employed with an appropriate drive circuit 106 and/or filter to provide a plurality of corresponding wavelengths.

The above embodiments illustrate various examples of conductive masses 270*a*, 270*b*, 270*c* and 270*d*. It will be appreciated that that these illustrations of the shape or appearance of conductive masses 270*a*, 270*b*, 270*c* and 270*d* are for illustration purposes only and may or may not represent the actual shape or appearance of conductive masses 270*a*, 270*b*, 270*c* and 270*d*. Further, it will be appreciated that conductive masses 270*a*, 270*b*, 270*c* and 270*d* are formed principally within overlap areas 280*a*, 280*b*, 280*c* and 280*d* but may occupy space entirely within overlap areas 280*a*, 280*b*, 280*c* and 280*d* or may extend outside of overlap areas 280*a*, 280*b*, 280*c* and 280*d*.

Other embodiments of the present disclosure will be apparent to those skilled in the art from consideration of the specification and practice of the various embodiments disclosed herein. It is intended that the specification and examples be considered as exemplary only, with a true scope and spirit of the present disclosure being indicated by the following claims.

What is claimed is:

1. A laser core comprising: a light source; a header having a base with a stem extending therefrom; a terminal extending from a sealed opening in the base proximate to but separate from the stem; a conductive surface positioned between the stem and the terminal; a conductive path electrically connecting the conductive surface to the light source; and a conductive mass extending from the terminal to the conductive surface, the conductive mass having a cross-sectional area that is based upon a size of an overlap area between the terminal and the conductive surface, the conductive surface being separate from the conductive mass and the light source, wherein the conductive mass includes a first end and a second end opposite the first end, the first end being connected to the terminal and having a first width that is approximately equal to a width of the terminal, the second end being connected to the conductive surface and having a second width that is greater than the first width, the first end includes a first length extending transverse to the first width, and the second end includes a second length extending transverse to the second width, wherein the second length is greater than the first length and the second width.

2. The laser core of claim 1, wherein the conductive mass is configured to direct power from the terminal to the conductive surface, and the conductive path and the conductive surface comprise separate components of the laser core.

3. The laser core of claim 1, wherein the size of the overlap area is determined at least in part so that the conductive mass is formed having an electrical resistance that is below a predetermined electrical resistance.

4. The laser core of claim 1, further comprising a submount connected to the stem, wherein the conductive surface and the conductive path extend along a top surface of the submount, and the light source is supported on the top surface.

5. The laser core of claim 1, wherein the size of the overlap area is determined at least in part so that a conductive mass is formed having an thermal conductivity that is above a predetermined thermal conductivity.

6. The laser core of claim 4, further comprising a conductive pad disposed on the top surface and supporting the light source on the submount.

7. The laser core of claim 1, wherein the overlap area has a size that is determined so that the conductive mass has a predetermined range of resistance to the propagation of at least one of a crack, a fissure, a void, and an unwanted inclusion within the conductive mass.

8. The laser core of claim 1, wherein the terminal and the conductive surface are separated by a separation distance that allows a flow of the conductive mass, in liquified form, between the terminal and the conductive surface such that the flow is at least in part influenced by capillary action.

9. The laser core of claim 1, wherein at least one of the conductive surface and the terminal are defined to limit the extent of capillary action-influenced flow.

10. The laser core of claim 1, wherein the conductive mass is configured to resist a shear force of approximately 16.5 kN.

11. The laser core of claim 1, wherein one of the terminal and the conductive surface is thermosonically welded to a conductive mass of material extending from the other of the terminal and the conductive surface.

12. The laser core of claim 1, wherein the conductive mass comprises a conductive adhesive.

13. The laser core of claim 12, wherein the conductive adhesive comprises an adhesive binder having conductive filler materials.

14. The laser core of claim 13, wherein the adhesive binder comprises at least one of a thermoplastic or a thermoset plastic.

15. The laser core of claim 13, wherein the conductive filler materials comprise at least one of a noble metal, copper, a conductive form of carbon, or a conductive carbon-based composite.

16. The laser core of claim 12, wherein the conductive adhesive is applied to at least one of the terminal and the conductive surface in a predetermined non-uniform pattern.

17. The laser core of claim 1, wherein the conductive surface comprises a conductive surface of the light source and wherein the overlap area comprises an area in which the terminal overlaps the conductive surface of the light source.

18. The laser core of claim 1, further comprising an enclosure that is sealed to the base and that surrounds the stem to provide a sealed environment about the light source and that provides a path for light generated by the light source to exit the enclosure.

19. The laser core of claim 18, wherein the enclosure includes a window optically downstream of the light source and defining at least part of the path.

20. The laser core of claim 6, wherein the conductive path extends from the conductive surface to the conductive pad, and is configured to direct power to the light source via the conductive pad.

* * * * *